United States Patent
Uehara et al.

(10) Patent No.: US 12,184,293 B2
(45) Date of Patent: Dec. 31, 2024

(54) CIRCUIT DEVICE AND OSCILLATOR

(71) Applicant: SEIKO EPSON CORPORATION, Tokyo (JP)

(72) Inventors: Jun Uehara, Fujimi (JP); Akio Tsutsumi, Chino (JP); Hideki Sato, Suwa (JP)

(73) Assignee: SEIKO EPSON CORPORATION (JP)

( * ) Notice: Subject to any disclaimer, the term of this patent is extended or adjusted under 35 U.S.C. 154(b) by 16 days.

(21) Appl. No.: 18/192,111

(22) Filed: Mar. 29, 2023

(65) Prior Publication Data

US 2023/0318608 A1 Oct. 5, 2023

(30) Foreign Application Priority Data

Mar. 30, 2022 (JP) ................. 2022-055189

(51) Int. Cl.
| | |
|---|---|
| *H03L 7/099* | (2006.01) |
| *H02M 3/07* | (2006.01) |
| *H03K 5/26* | (2006.01) |
| *H03L 7/093* | (2006.01) |

(52) U.S. Cl.
CPC ............ *H03L 7/099* (2013.01); *H02M 3/07* (2013.01); *H03K 5/26* (2013.01); *H03L 7/093* (2013.01)

(58) Field of Classification Search
CPC ......... H03L 7/0891; H03L 7/085; H03L 7/08; H03L 7/06; H03L 7/00; H03L 7/087; H03L 7/091
See application file for complete search history.

(56) References Cited

U.S. PATENT DOCUMENTS 10,268,164 B2 * 4/2019 Tsutsumi ................ H03L 7/099
11,063,599 B2 * 7/2021 Zuo ...................... H01L 29/7833

FOREIGN PATENT DOCUMENTS

JP 2014-030120 A 2/2014

OTHER PUBLICATIONS

J. Tao et al., "A 2.2-GHz 3.2-mW DTC-Free Sampling $\Delta\Sigma$ Fractional-N PLL With -110-dBc/Hz In-Band Phase Noise and -246-dB FoM and -83-dBc Reference Spur", IEEE, Transactions on Circuits and Systems-1: Regular Papers, vol. 66, No. 9, Sep. 2019, pp. 3317-3329.

* cited by examiner

*Primary Examiner* — Diana J. Cheng
(74) *Attorney, Agent, or Firm* — Harness, Dickey & Pierce, P.L.C.

(57) ABSTRACT

A circuit device includes: a first phase comparison circuit including a sampling circuit that samples a feedback signal based on a reference clock signal; a first charge pump circuit configured to output a current corresponding to a sampling voltage; a second phase comparison circuit including a dead zone detection circuit that detects whether a phase difference between the reference clock signal and a feedback clock signal falls within a dead zone, and configured to output a phase difference signal when the phase difference does not fall within the dead zone; a second charge pump circuit; and a clock signal generation circuit configured to generate the clock signal having a frequency controlled based on an output of the first charge pump circuit or the second charge pump circuit. The second charge pump circuit is set disabled or in a low power consumption mode in a dead zone period.

13 Claims, 18 Drawing Sheets

CIRCUIT DEVICE AND OSCILLATOR

The present application is based on, and claims priority from JP Application Serial Number 2022-055189, filed Mar. 30, 2022, the disclosure of which is hereby incorporated by reference herein in its entirety.

BACKGROUND

1. Technical Field

The present disclosure relates to a circuit device, an oscillator, and the like.

2. Related Art

In the related art, a voltage sampling type PLL such as a sampling PLL or a sub-sampling PLL is known. For example, J. Tao et al, "A 2.2-GHz 3.2-mW DTC-Free Sampling ΔΣ Fractional-N PLL With −110-dBc/Hz In-Band Phase Noise and −246-dB FoM and −83-dBc Reference Spur", IEEE Transactions on Circuits and Systems-I: Regular Papers, vol. 66, No. 9, pp. 3317-3328, September 2019 discloses that, in a sampling PLL, an edge of a clock to be sampled is tilted by a linear slope generator (LSG), thereby implementing a fractional PLL with high accuracy without using a digital-to-time converter (DTC).

Since such a voltage sampling type PLL has two feedback loops, power consumption is large.

SUMMARY

An aspect of the present disclosure relates to a circuit device including: a first phase comparison circuit including a sampling circuit that samples a feedback signal of a clock signal based on a reference clock signal, and configured to output a sampling voltage of the sampling circuit; a first charge pump circuit configured to output a current corresponding to the sampling voltage; a second phase comparison circuit including a dead zone detection circuit that detects whether a phase difference between a feedback clock signal of the clock signal and the reference clock signal falls within a dead zone, and configured to output a phase difference signal obtained based on a phase comparison between the reference clock signal and the feedback clock signal when the phase difference does not fall within the dead zone; a second charge pump circuit configured to perform a charge pump operation corresponding to the phase difference signal; and a clock signal generation circuit configured to generate the clock signal having a frequency controlled based on an output of the first charge pump circuit or an output of the second charge pump circuit. The second charge pump circuit is set disabled or in a low power consumption mode in a dead zone period during which the phase difference falls within the dead zone.

Another aspect of the present disclosure relates to an oscillator including: the circuit device described above; and a resonator configured to generate the reference clock signal.

DESCRIPTION OF EXEMPLARY EMBODIMENTS

Hereinafter, an embodiment will be described. The embodiment to be described below does not unduly limit contents described in the claims. Further, all configurations described in the embodiment are not necessarily essential constituent elements.

1. Circuit Device

Figure 1:
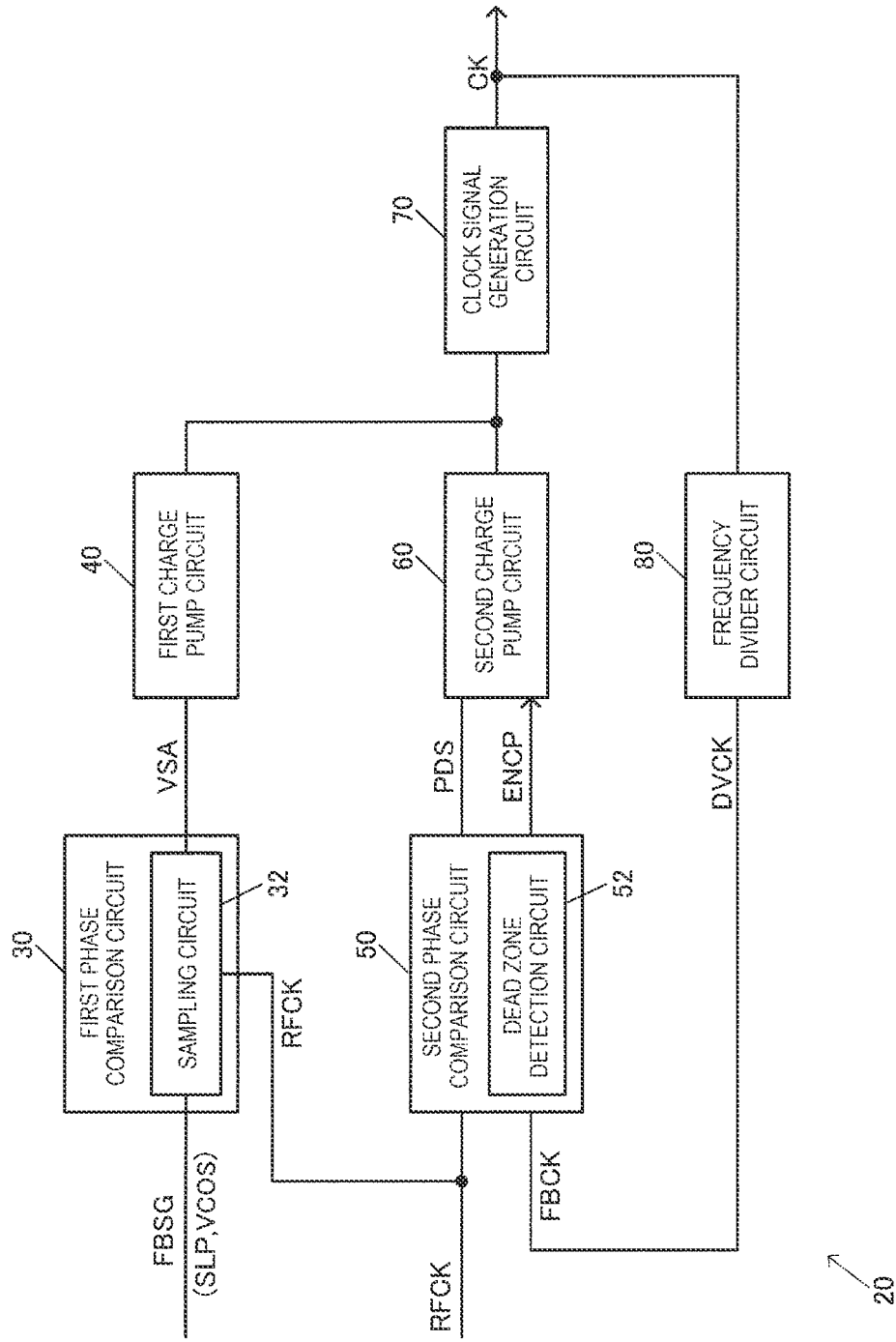
FIG. 1 shows a configuration example of a circuit device according to an embodiment.

FIG. 1 shows a configuration example of a circuit device 20 according to the embodiment. The circuit device 20 includes a first phase comparison circuit 30, a first charge pump circuit 40, a second phase comparison circuit 50, a second charge pump circuit 60, and a clock signal generation circuit 70. The circuit device 20 may include a frequency divider circuit 80. A phase locked loop (PLL) circuit is implemented by the circuit device 20 having this configuration. The circuit device 20 is an integrated circuit device called an integrated circuit (IC). For example, the circuit device 20 is an IC manufactured by a semiconductor process, and is a semiconductor chip in which a circuit element is formed on a semiconductor substrate.

The first phase comparison circuit 30 includes a sampling circuit 32 that samples a feedback signal FBSG of a clock signal CK based on a reference clock signal RFCK, and the first phase comparison circuit 30 outputs a sampling voltage VSA of the sampling circuit 32. For example, the sampling circuit 32 samples the feedback signal FBSG with the reference clock signal RFCK or a signal which is based on the reference clock signal RFCK. The feedback signal FBSG of the clock signal CK is a feedback signal in a feedback loop of a voltage sampling type PLL. The feedback signal FBSG is, for example, a slope signal SLP in FIG. 2, or an oscillation signal VCOS of a VCO in FIG. 3, which will be described later. The first phase comparison circuit 30 outputs, as the sampling voltage VSA, a voltage obtained by the sampling circuit 32 sampling the feedback signal FBSG. The reference clock signal RFCK is, for example, a clock signal generated by vibrating a resonator to be described later.

The first charge pump circuit 40 outputs a current corresponding to the sampling voltage VSA in the sampling circuit 32. For example, the first charge pump circuit 40 outputs a current that increases as the sampling voltage VSA increases to the clock signal generation circuit 70 as a charge pump current. Accordingly, the clock signal generation circuit 70 outputs the clock signal CK having a frequency corresponding to the charge pump current.

The second phase comparison circuit 50 outputs a phase difference signal PDS obtained based on a phase comparison between the reference clock signal RFCK and the feedback clock signal FBCK. Specifically, the second phase comparison circuit 50 includes a dead zone detection circuit 52 that detects whether a phase difference between the feedback clock signal FBCK of the clock signal CK and the reference clock signal RFCK falls within a dead zone. The phase difference can also be referred to as a phase error. The dead zone is a dead band, and is, for example, a range where the phase difference between the reference clock signal RFCK and the feedback clock signal FBCK is equal to or less than a threshold value. The dead zone detection circuit 52 performs such a dead zone generation processing, and determines whether the phase difference between the reference clock signal RFCK and the feedback clock signal FBCK falls within the dead zone. The dead zone is generated based on a delay time of a delay circuit provided in the dead zone detection circuit 52. When the phase difference does not fall within the dead zone, the second phase comparison circuit 50 outputs the phase difference signal PDS obtained based on the phase comparison between the reference clock signal RFCK and the feedback clock signal FBCK. For example, the second phase comparison circuit 50 outputs, as the phase difference signal PDS, an up signal or a down signal based on the phase comparison between the reference clock signal RFCK and the feedback clock signal FBCK. For example, the second phase comparison circuit 50 outputs the up signal when the feedback clock signal FBCK is delayed in phase with respect to the reference clock signal RFCK, and outputs the down signal when the feedback clock signal FBCK is advanced in phase with respect to the reference clock signal RFCK.

The second charge pump circuit 60 performs a charge pump operation corresponding to the phase difference signal PDS from the second phase comparison circuit 50. For example, when the up signal is input as the phase difference signal PDS, the second charge pump circuit 60 generates, as the charge pump current, an up current flowing from a high-potential-side power supply to an output node of the second charge pump circuit 60 in an active period of the up signal. When the down signal is input as the phase difference signal PDS, the second charge pump circuit 60 generates, as the charge pump current, a down current flowing from the output node of the second charge pump circuit 60 to a low-potential-side power supply in an active period of the down signal.

The clock signal generation circuit 70 generates the clock signal CK having a frequency controlled based on an output of the first charge pump circuit 40 or an output of the second charge pump circuit 60. For example, the clock signal generation circuit 70 generates the clock signal CK having a frequency controlled based on a charge pump current of the first charge pump circuit 40 or a charge pump current of the second charge pump circuit 60. For example, the circuit device 20 performs a first synchronous operation in a first feedback loop including the first phase comparison circuit 30, the first charge pump circuit 40, and the clock signal generation circuit 70, and a second synchronous operation in a second feedback loop including the second phase comparison circuit 50, the second charge pump circuit 60, and the clock signal generation circuit 70. The first synchronous operation is, for example, a sampling phase locked loop (SPLL) operation, and the second synchronous operation is, for example, a frequency locked loop (FLL) operation. The SPLL operation may be an operation of a sampling PLL in FIG. 2, or an operation of a sub-sampling PLL in FIG. 3, which will be described later. In the embodiment, an operation of a voltage sampling type PLL such as a sampling PLL or a sub-sampling PLL is referred to as the SPLL operation. The clock signal generation circuit 70 generates the clock signal CK having a frequency controlled based on the charge pump current of the first charge pump circuit 40 during the first synchronous operation, and generates the clock signal CK having a frequency controlled based on the charge pump current of the second charge pump circuit 60 during the second synchronous operation.

The frequency divider circuit 80 frequency-divides the clock signal CK and outputs a frequency-divided clock signal DVCK. For example, the clock signal generation circuit 70 generates the clock signal CK having a frequency obtained by multiplying a frequency of the reference clock signal RFCK. A multiplication factor in this case is set by a frequency division ratio of the frequency divider circuit 80. The frequency divider circuit 80 is, for example, a fractional divider circuit enabling fractional division in which a frequency division ratio includes decimals.

For example, a phase interpolation type frequency divider circuit or the like can be used as the frequency divider circuit 80. This makes it possible to implement a fractional-N type PLL circuit. The frequency divider circuit 80 may be an integer frequency divider circuit having a frequency division ratio of an integer.

In the embodiment, the second charge pump circuit 60 is set disabled or in a low power consumption mode in a dead zone period during which the phase difference between the reference clock signal RFCK and the feedback clock signal FBCK falls within the dead zone. When the second charge pump circuit 60 is set disabled, an operation of the second charge pump circuit 60 is stopped. For example, the operation of the second charge pump circuit 60 is stopped such that the second charge pump circuit 60 does not output the charge pump current. When the second charge pump circuit 60 is set disabled, for example, a control may be performed such that a current does not flow through a current path in the second charge pump circuit 60. For example, a current from a current source of an analog circuit constituting the second charge pump circuit 60 is prevented from flowing through the current path. When the second charge pump circuit 60 is set in the low power consumption mode, power consumption of the second charge pump circuit 60 can be set lower than that during a normal operation. For example, the low power consumption mode is set by reducing an amount of the current flowing through the current path in the second charge pump circuit 60. For example, a control for reducing an amount of the current from the current source of the analog circuit constituting the second charge pump circuit 60 is performed. By setting the second charge pump circuit 60 disabled or in the low power consumption mode in this manner, during the first synchronous operation in the first feedback loop including the first phase comparison circuit 30, the first charge pump circuit 40, and the clock signal generation circuit 70, wasteful power consumption in the second charge pump circuit 60 can be prevented, and thus low power consumption of the circuit device 20 can be implemented.

For example, in FIG. 1, the second phase comparison circuit 50 outputs a charge pump enable signal ENCP to the second charge pump circuit 60. For example, the second phase comparison circuit 50 generates the enable signal ENCP based on a detection result of the dead zone in the dead zone detection circuit 52, and outputs the enable signal ENCP to the second charge pump circuit 60. The enable signal ENCP is active in the non-dead zone period during which the phase difference does not fall within the dead zone, and is inactive in the dead zone period during which the phase difference falls within the dead zone. When the enable signal ENCP is active, the operation of the second charge pump circuit 60 is enabled, and the second charge pump circuit 60 outputs a charge pump current corresponding to the phase difference signal PDS to the clock signal generation circuit 70. On the other hand, when the enable signal ENCP is inactive, the operation of the second charge pump circuit 60 is set disabled or in the low power consumption mode. Accordingly, in the dead zone period during which the enable signal ENCP is inactive, the wasteful power consumption in the second charge pump circuit 60 can be prevented.

Figure 2:
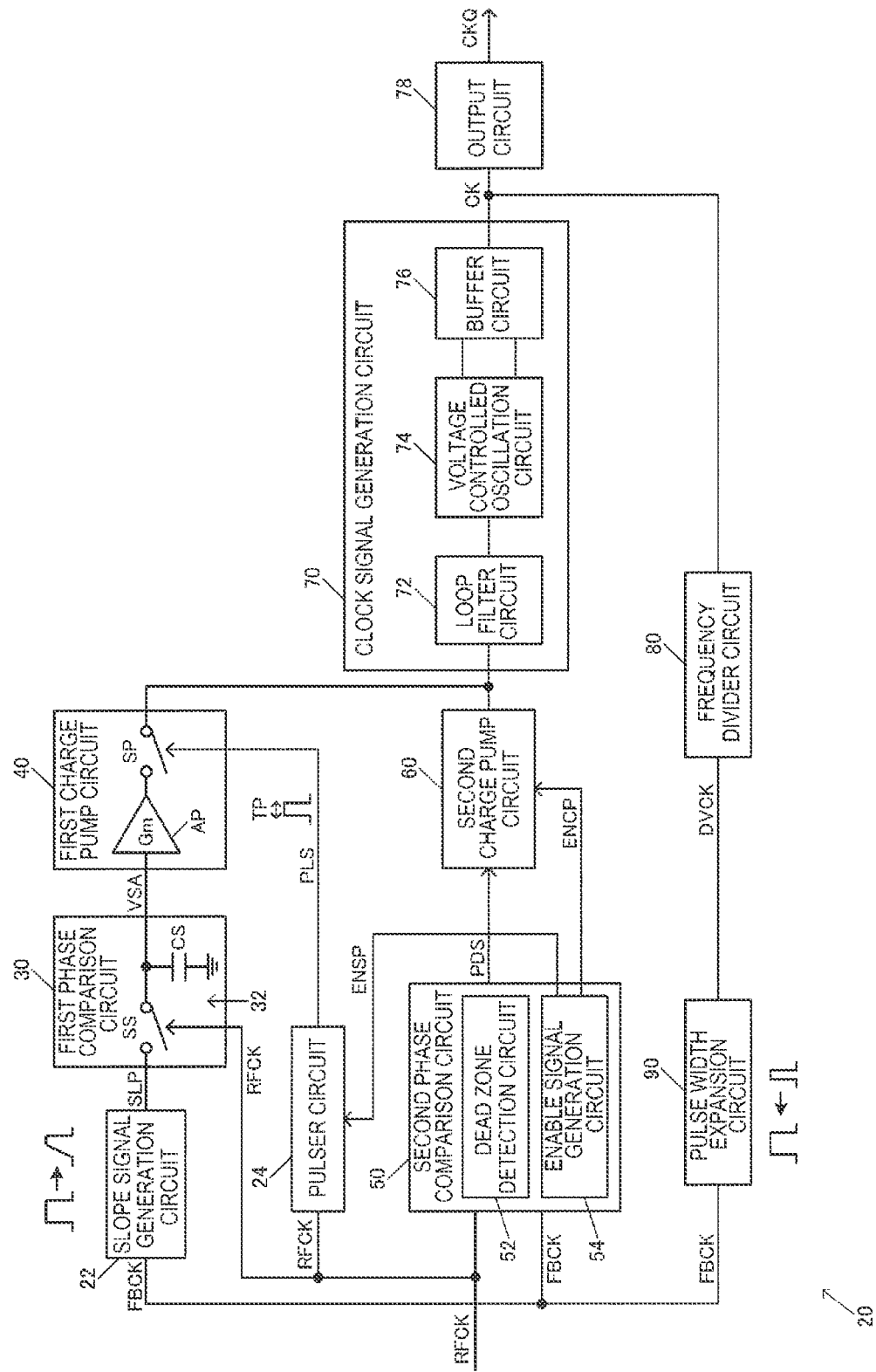
FIG. 2 shows a detailed configuration example of the circuit device according to the embodiment.
Figure 3:
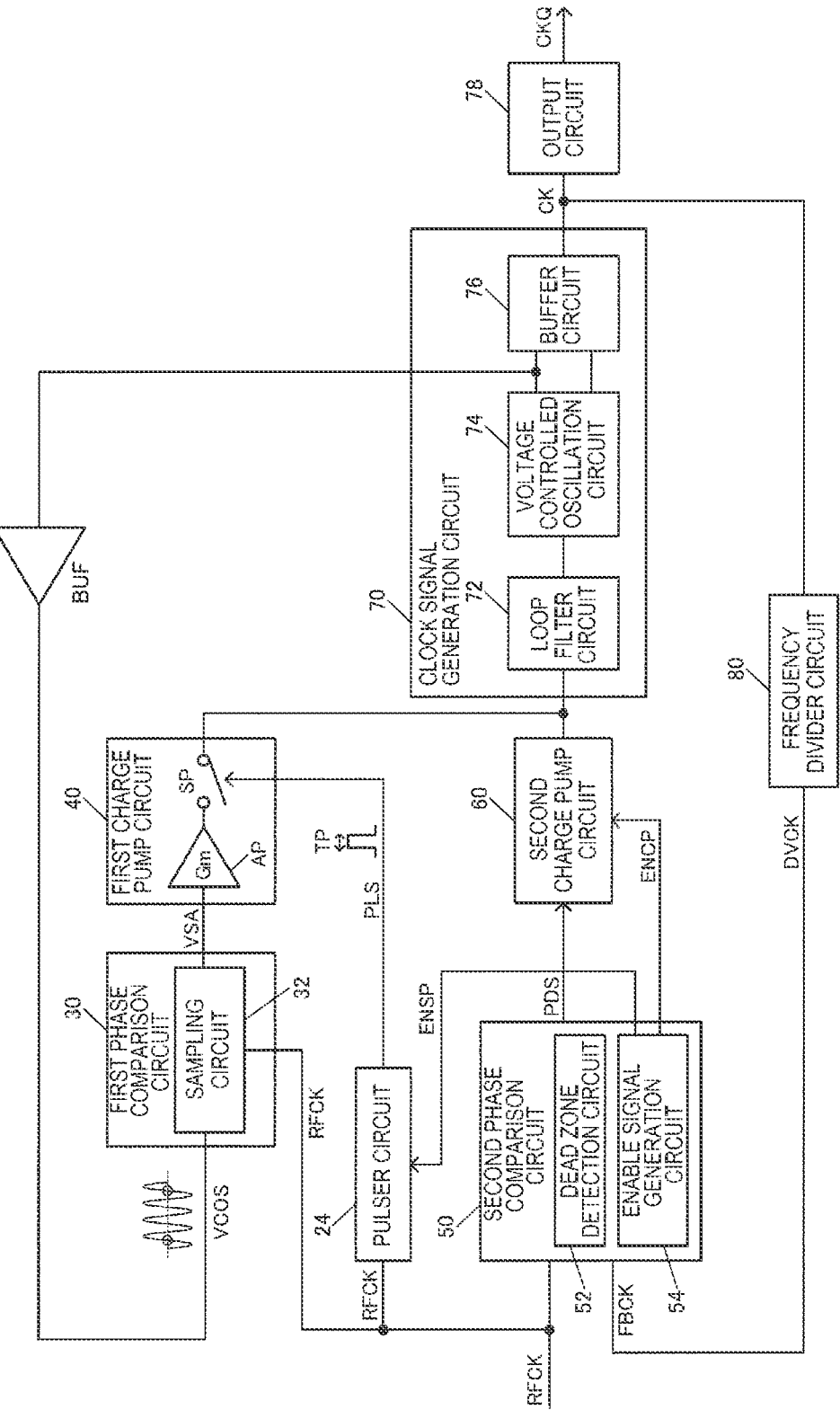
FIG. 3 shows another detailed configuration example of the circuit device according to the embodiment.

FIGS. 2 and 3 show a detailed configuration example of the circuit device 20 according to the embodiment. The circuit device 20 is not limited to the configuration in FIGS. 2 and 3, and various modifications such as omitting some of the components, adding other components, and replacing some of the components with other components can be made.

FIG. 2 is a configuration example of the circuit device 20 when the PLL implemented by the embodiment is the sampling PLL. In FIG. 2, the circuit device 20 includes a slope signal generation circuit 22 and a pulser circuit 24 in addition to the configuration in FIG. 1. The circuit device 20 may include a pulse width expansion circuit 90 and an output circuit 78.

The slope signal generation circuit 22 generates the slope signal SLP based on the feedback clock signal FBCK of the clock signal CK. The slope signal generation circuit 22 is, for example, a circuit called a linear slope generator (LSG). The feedback clock signal FBCK is a clock signal obtained by feeding back the clock signal CK. For example, in FIG. 2, a clock signal obtained by feeding the clock signal CK that is generated by the clock signal generation circuit 70 back to an input side via the frequency divider circuit 80 or the like is the feedback clock signal FBCK. The feedback clock signal FBCK is a rectangular wave clock signal, and the slope signal generation circuit 22 generates the slope signal SLP having a linear slope from the rectangular wave feedback clock signal FBCK. A slope of the slope signal SLP may be substantially linear. For example, the slope signal generation circuit 22 generates the slope signal SLP obtained by tilting an edge of the rectangular wave feedback clock signal FBCK.

The pulser circuit 24 outputs a pulse signal PLS based on the reference clock signal RFCK. For example, the pulser circuit 24 outputs the pulse signal PLS having a predetermined pulse width that is active each time the reference clock signal RFCK is active. For example, the pulser circuit 24 includes a first delay circuit and a second delay circuit. The pulser circuit 24 is active at a timing delayed by a first delay time of the first delay circuit from a timing at which the reference clock signal RFCK is turned to be active, and outputs the pulse signal PLS that is active during a second delay time of the second delay circuit. An active level is one of a high level and a low level, and an inactive level is another one of the high level and the low level.

The sampling circuit 32 of the first phase comparison circuit 30 includes a sampling switch circuit SS and a sampling capacitor CS. The sampling switch circuit SS is provided between an output node of the slope signal generation circuit 22 and a sampling node of the sampling voltage VSA, and is turned on when the reference clock signal RFCK is active. One end of the sampling capacitor CS is coupled to the sampling node of the sampling voltage VSA. By providing the sampling switch circuit SS and the capacitor CS as described above, a voltage of the slope signal SLP at a timing at which the reference clock signal RFCK changes from active to inactive can be sampled as the sampling voltage VSA.

The first charge pump circuit 40 includes an amplifier circuit AP and a charge pump switch circuit SP. The amplifier circuit AP is also called a transconductor, and is, for example, a circuit that performs voltage-current conversion corresponding to a transconductance Gm. For example, the amplifier circuit AP converts the sampling voltage VSA into a current and outputs the current. For example, the amplifier circuit AP outputs a current that increases as the sampling voltage VSA increases. The charge pump switch circuit SP is turned on in an active period during which the pulse signal PLS from the pulser circuit 24 having a pulse width TP is active. Accordingly, the first charge pump circuit 40 outputs a current corresponding to the sampling voltage VSA to the clock signal generation circuit 70 in an active period of the pulse signal PLS.

The second phase comparison circuit 50 includes the dead zone detection circuit 52 and an enable signal generation circuit 54. The configuration and operation of the dead zone detection circuit 52 are as described above.

The enable signal generation circuit 54 generates an enable signal ENSP for the pulser circuit 24 and the enable signal ENCP for the second charge pump circuit 60. The enable signal ENSP is a first enable signal, and is, for example, a signal for enabling or disabling an operation of the pulser circuit 24. The enable signal ENCP is a second enable signal, and is, for example, a signal for enabling or disabling the operation of the second charge pump circuit 60. The enable signal generation circuit 54 generates the enable signal ENSP and the enable signal ENCP based on the detection result of the dead zone. The enable signal generation circuit 54 may generate an inverted signal of the enable signal ENSP as the enable signal ENCP, or may generate the enable signal ENSP and the enable signal ENCP, separately.

The clock signal generation circuit 70 includes a loop filter circuit 72, a voltage controlled oscillation circuit 74, and a buffer circuit 76. The loop filter circuit 72 generates a control voltage for controlling an oscillation frequency of the voltage controlled oscillation circuit 74. For example, the loop filter circuit 72 integrates and smooths the charge pump current from the first charge pump circuit 40 or the charge pump current from the second charge pump circuit 60 to generate the control voltage. The loop filter circuit 72 can be implemented by, for example, an RC low-pass filter including a capacitor and a resistor. The voltage controlled oscillation circuit 74, which is the VCO, generates an oscillation signal whose oscillation frequency is controlled by the control voltage from the loop filter circuit 72. The voltage controlled oscillation circuit 74 may be implemented by an LC type oscillation circuit using an inductor and a capacitor, or may be implemented by a loop type oscillation circuit in which a plurality of inverter circuits are coupled in a loop shape. The buffer circuit 76 buffers the oscillation signal generated by the voltage controlled oscillation circuit 74 to generate the clock signal CK. For example, when the voltage controlled oscillation circuit 74 generates a differential oscillation signal, the buffer circuit 76 generates and outputs the rectangular wave clock signal CK based on the differential sinusoidal oscillation signal. The output circuit 78 buffers the clock signal CK and outputs an output clock signal CKQ to the outside. For example, the output circuit 78 outputs the output clock signal CKQ in a single-ended CMOS signal format. Alternatively, the output circuit 78 may output the output clock signal CKQ in a signal format such as low voltage differential signaling (LVDS) or positive emitter counted logic (PECL).

As described above, in the embodiment, the clock signal generation circuit 70 includes the loop filter circuit 72 that outputs the control voltage having the oscillation frequency based on the output of the first charge pump circuit 40 or the output of the second charge pump circuit 60, and the voltage controlled oscillation circuit 74 that generates the clock signal CK having the oscillation frequency corresponding to the control voltage. In this way, during the first synchronous operation in the first feedback loop including the first phase comparison circuit 30, the first charge pump circuit 40, and the clock signal generation circuit 70, the loop filter circuit 72 outputs the control voltage based on the output of the first charge pump circuit 40, and the voltage controlled oscillation circuit 74 generates the clock signal CK having the oscillation frequency corresponding to the control voltage. During the second synchronous operation in the second feedback loop including the second phase comparison circuit 50, the second charge pump circuit 60, and the clock signal generation circuit 70, the loop filter circuit 72 outputs the control voltage based on the output of the second charge pump circuit 60, and the voltage controlled oscillation circuit 74 generates the clock signal CK having the oscillation frequency corresponding to the control voltage. Accordingly, the clock signal CK generated by the first synchronous operation in the first feedback loop can be generated, and the clock signal CK generated by the second synchronous operation in the second feedback loop can be generated.

The pulse width expansion circuit 90 expands a pulse width of the frequency-divided clock signal DVCK and outputs the expanded frequency-divided clock signal DVCK as the feedback clock signal FBCK. For example, the pulse width expansion circuit 90 expands a pulse width of the feedback clock signal FBCK such that the feedback clock signal FBCK changes from active to inactive after a timing at which the pulse signal PLS changes from active to inactive. In this way, since a voltage level of the feedback clock signal FBCK does not change in the active period of the pulse signal PLS, fluctuation in the sampling voltage VSA caused by a change in the voltage level of the feedback clock signal FBCK can be prevented. Instead of providing the pulse width expansion circuit 90 in the circuit device 20, the frequency-divided clock signal DVCK of the frequency divider circuit 80 may be input to the slope signal generation circuit 22 or the like as the feedback clock signal FBCK.

FIG. 3 shows a configuration example of the circuit device 20 when the PLL implemented by the embodiment is the sub-sampling PLL. FIG. 3 is different from the configuration in FIG. 2 in that, in FIG. 3, the oscillation signal VCOS from the voltage controlled oscillation circuit 74 of the clock signal generation circuit 70 is fed back to the first phase comparison circuit 30 as the feedback signal FBSG in FIG. 1. In FIG. 3, the slope signal generation circuit 22 and the pulse width expansion circuit 90 in FIG. 2 are not provided. In FIG. 3, the oscillation signal VCOS of the VCO is input to the first phase comparison circuit 30 via a buffer circuit BUF, but a configuration without the buffer circuit BUF is also possible.

In the sub-sampling PLL in FIG. 3, the sinusoidal oscillation signal VCOS from the voltage controlled oscillation circuit 74, which is the VCO, is input to the first phase comparison circuit 30 as the feedback signal FBSG, and the sampling circuit 32 of the first phase comparison circuit 30 samples the oscillation signal VCOS based on the reference clock signal RFCK. A slope of the sinusoidal oscillation signal VCOS at, for example, a zero cross point has a function same as that of the slope of the slope signal SLP in FIG. 2. In this case, in the sub-sampling PLL in FIG. 3, sampling is performed for every M sinusoidal waveforms of the oscillation signal VCOS. For example, a fractional-N type sub-sampling PLL can be implemented by setting a sampling timing of the oscillation signal VCOS with a time-to-digital converter (DCT) including a delta-sigma modulator.

Since the sub-sampling PLL does not include the frequency divider circuit in the first feedback loop thereof, there is an advantage that noise caused by the frequency divider circuit can be reduced. On the other hand, since the first phase comparison circuit 30 needs to perform sampling processing on the oscillation signal VCOS having a high frequency of, for example, several GHz, there is a disadvantage that it is difficult to operate or design the first phase comparison circuit 30 using a CMOS circuit. The technique of the embodiment can be applied not only to the sampling PLL in FIG. 2 but also to the sub-sampling PLL in FIG. 3. In the following, for simplification of explanation, a case where the technique of the embodiment is applied to the sampling PLL will be mainly described as an example.

Figure 4:
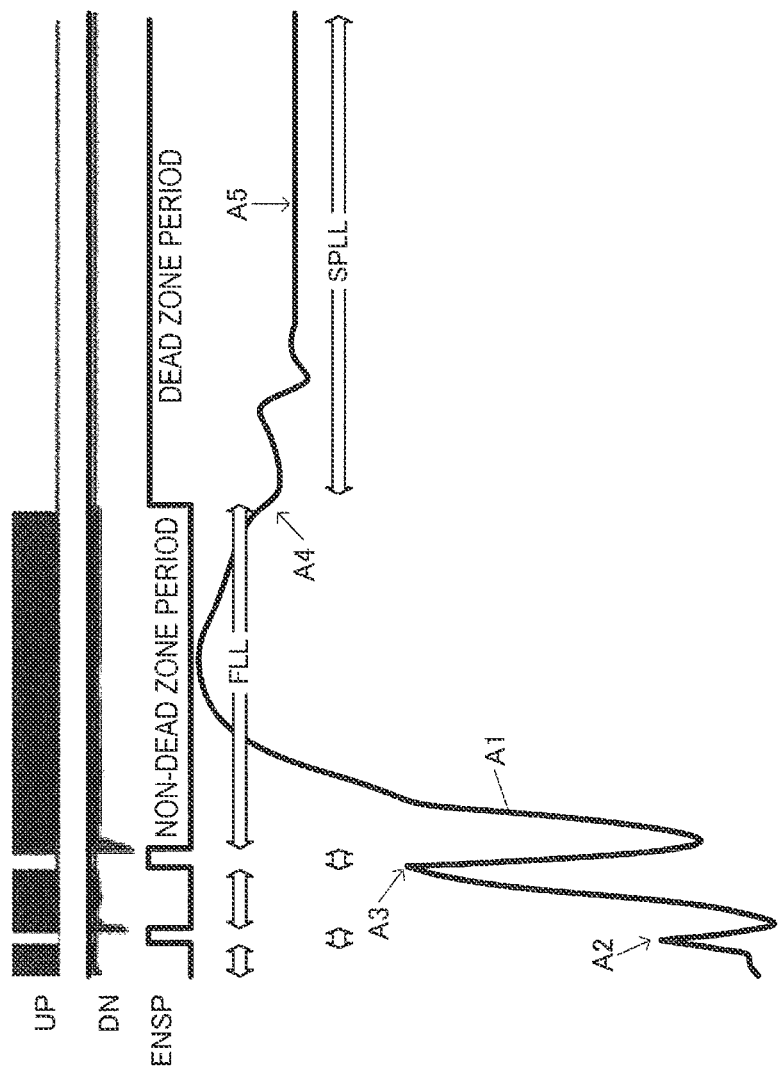
FIG. 4 is a signal waveform diagram showing an operation of the circuit device according to the embodiment.

FIG. 4 is a signal waveform diagram showing an operation of the circuit device 20 according to the embodiment. For example, after power-on, the circuit device 20 performs the FLL operation, which is the second synchronous operation in the second feedback loop. For example, the second charge pump circuit 60 performs the charge pump operation with an up signal UP and a down signal DN that are output by the second phase comparison circuit 50 based on the phase comparison between the reference clock signal RFCK and the feedback clock signal FBCK. The charge pump current generated by the charge pump operation is input to the loop filter circuit 72 to generate a control voltage, and the clock signal CK is generated by an oscillation operation of the voltage controlled oscillation circuit 74 based on the control voltage. The clock signal CK is fed back as the feedback clock signal FBCK to the second phase comparison circuit 50 via the frequency divider circuit 80 or the like. Accordingly, as shown by A1 in FIG. 4, the FLL operation is performed to bring the frequency of the feedback clock signal FBCK closer to the frequency of the reference clock signal RFCK. A frequency division ratio setting code for setting the clock signal CK to have a target frequency is set in the frequency divider circuit 80. For example, a relationship of fck=DV×frf is satisfied, where fck is the frequency of the clock signal CK, frf is the frequency of the reference clock signal RFCK, and DV is the frequency division ratio.

Specifically, the dead zone detection circuit 52 detects whether the phase difference between the reference clock signal RFCK and the feedback clock signal FBCK falls within the dead zone, and the second charge pump circuit 60 performs the charge pump operation in the non-dead zone period during which the phase difference does not fall within the dead zone, thereby performing the FLL operation in the second feedback loop. In A2 and A3 in FIG. 4, the enable signal ENSP of the SPLL operation is transiently active. This is because even when having different frequencies, the reference clock signal RFCK and the feedback clock signal FBCK are determined to have the same frequency when the phases thereof are rotated 360 degrees.

By such an FLL operation, as indicated by A4, the frequency of the feedback clock signal FBCK is brought closer to the frequency of the reference clock signal RFCK, and it is detected that the phase difference falls within the dead zone. In the dead zone period during which the phase difference falls within the dead zone, the enable signal ENSP is active. Accordingly, the pulser circuit 24 outputs the pulse signal PLS, and the first charge pump circuit 40 outputs the charge pump current corresponding to the sampling voltage VSA of the sampling circuit 32 of the first phase comparison circuit 30 in the active period of the pulse signal PLS. The charge pump current is input to the loop filter circuit 72 to generate a control voltage, and the clock signal CK is generated by the oscillation operation of the voltage controlled oscillation circuit 74 based on the control voltage. Accordingly, as indicated by A5 in FIG. 4, phase synchronization is performed by the SPLL to bring phases of the reference clock signal RFCK and the feedback clock signal FBCK closer to each other.

Thus, in FIG. 4, the FLL operation in the second feedback loop is performed until the phase difference between the reference clock signal RFCK and the feedback clock signal FBCK falls within the dead zone. When it is detected that the phase difference falls within the dead zone, the FLL operation in the second feedback loop is switched to the SPLL operation in the first feedback loop. According to the SPLL operation in the first feedback loop, a gain in the PLL can be increased and in-band noise of the PLL can be reduced as compared with the FLL operation in the second feedback loop. That is, the gain in the SPLL operation is set by the slope of the slope signal SLP, the transconductance Gm of the amplifier circuit AP, a length of the active period of the pulse signal PLS, and the like. For example, the gain can be set large by increasing the slope of the slope signal SLP, the transconductance Gm, or the active period of the pulse signal PLS. Accordingly, for example, even when the phase difference between the reference clock signal RFCK and the feedback clock signal FBCK increases, the phase difference can be brought closer in a short time due to the large gain in the PLL, and thus the in-band noise can be reduced as compared with that in the FLL operation. By reducing the in-band noise, phase noise of the clock signal CK can be reduced, and the clock signal CK having good noise characteristics can be generated.

As described above, according to the embodiment, it is possible to implement the PLL that performs the first synchronous operation in the first feedback loop including the first phase comparison circuit 30, the first charge pump circuit 40, and the clock signal generation circuit 70, and the second synchronous operation in the second feedback loop including the second phase comparison circuit 50, the second charge pump circuit 60, and the clock signal generation circuit 70.

In this case, in the embodiment, the second charge pump circuit 60 is set disabled or in the low power consumption mode in the dead zone period during which the phase difference between the reference clock signal RFCK and the feedback clock signal FBCK falls within the dead zone. That is, in FIG. 4, the second charge pump circuit 60 for the FLL operation is set disabled or in the low power consumption mode in the dead zone period during which the SPLL operation is performed. In this way, in the dead zone period during which the charge pump operation performed by the second charge pump circuit 60 is unnecessary, the wasteful power consumption in the second charge pump circuit 60 can be prevented, and as a result, increasing of the power consumption of the circuit device 20 can be prevented. Therefore, while implementing the PLL that enables the first synchronous operation in the first feedback loop and the second synchronous operation in the second feedback loop, the wasteful power consumption during the first synchronous operation in the first feedback loop can be prevented, and thus the low power consumption of the circuit device 20 can be implemented.

The circuit device 20 according to the embodiment includes the pulser circuit 24 that outputs the pulse signal PLS based on the reference clock signal RFCK, and the first charge pump circuit 40 outputs a current corresponding to the sampling voltage VSA in the active period of the pulse signal PLS. The pulser circuit 24 is set disabled or in the low power consumption mode in the non-dead zone period during which the phase difference between the reference clock signal RFCK and the feedback clock signal FBCK does not fall within the dead zone. That is, in FIG. 4, in the non-dead zone period during which the FLL operation is performed, the pulser circuit 24 for the SPLL operation is set disabled or in the low power consumption mode. For example, when the pulser circuit 24 is set disabled, the operation of the pulser circuit 24 is stopped. For example, the operation of the pulser circuit 24 is stopped such that the pulser circuit 24 does not output the pulse signal PLS. Further, when the pulser circuit 24 is set disabled, for example, a control may be performed such that a current does not flow through a current path in the pulser circuit 24. For example, a current from a current source of an analog circuit constituting the pulser circuit 24 is prevented from flowing to the current path. When the pulser circuit 24 is set in the low power consumption mode, power consumption of the pulser circuit 24 is set to be lower than that in the normal operation. The low power consumption mode is set by reducing an amount of the current flowing through the current path in the pulser circuit 24. For example, a control for reducing an amount of the current from the current source of the analog circuit constituting the pulser circuit 24 is performed.

By setting the pulser circuit 24 disabled or in the low power consumption mode in the non-dead zone period in this manner, during the second synchronous operation in the second feedback loop including the second phase comparison circuit 50, the second charge pump circuit 60, and the clock signal generation circuit 70, wasteful power consumption in the pulser circuit 24 can be prevented, and thus the low power consumption of the circuit device 20 can be implemented.

Specifically, as shown in FIGS. 2 and 3, the second phase comparison circuit 50 includes the enable signal generation circuit 54 that generates the enable signal ENSP that is active in the dead zone period and outputs the enable signal ENSP to the pulser circuit 24. The pulser circuit 24 is set disabled or in the low power consumption mode when the enable signal ENSP is inactive. On the other hand, the second charge pump circuit 60 is set disabled or in the low power consumption mode when the enable signal ENSP is active. In this way, when the enable signal ENSP is inactive in the non-dead zone period in FIG. 4, the pulser circuit 24 is set disabled or in the low power consumption mode, and thus the wasteful power consumption in the pulser circuit 24, which does not need to operate in the second synchronous operation in the second feedback loop, can be prevented. On the other hand, when the enable signal ENSP is active in the dead zone period in FIG. 4, the second charge pump circuit 60 is set disabled or in the low power consumption mode, and thus the wasteful power consumption in the second charge pump circuit 60, which does not need to operate in the first synchronous operation in the first feedback loop, can be prevented.

In FIGS. 2 and 3, the charge pump enable signal ENCP input to the second charge pump circuit 60 is an inverted signal of the enable signal ENSP input to the pulser circuit 24. Therefore, when the enable signal ENSP is active, the enable signal ENCP input to the second charge pump circuit 60 is inactive, and thus the second charge pump circuit 60 is set disabled or in the low power consumption mode.

2. Slope Signal Generation Circuit and First Phase Comparison Circuit

Figure 5:
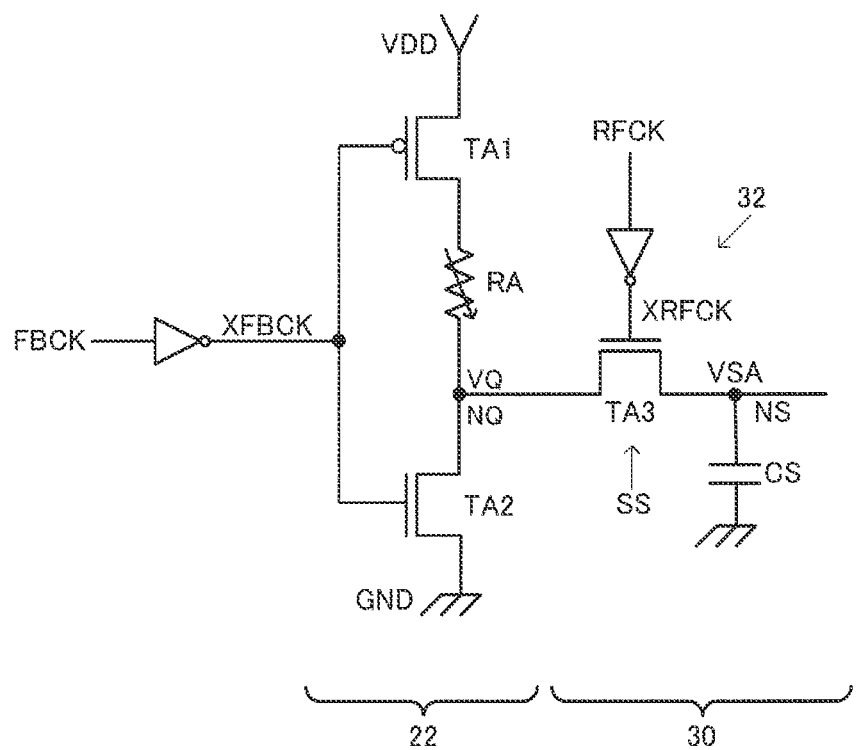
FIG. 5 shows a configuration example of a slope signal generation circuit and a first phase comparison circuit.

FIG. 5 shows a configuration example of the slope signal generation circuit 22 and the first phase comparison circuit 30. As shown in FIG. 5, the slope signal generation circuit 22 includes a P-type transistor TA1, a variable resistor RA, and an N-type transistor TA2 that are provided in series between the high-potential-side power supply node and the low-potential-side power supply node. The high-potential-side power supply node is, for example, a VDD node, and the low-potential-side power supply node is a GND node. For example, the P-type transistor TA1 include a source coupled to the VDD node and a drain coupled to one end of the variable resistor RA. Another end of the variable resistor RA is coupled to an output node NQ of the slope signal generation circuit 22 and the drain of the N-type transistor TA2. A source of the N-type transistor TA2 is coupled to the GND node. Here, a voltage of GND is a ground voltage, and the GND may be referred to as VSS. A voltage of VDD, which is the high-potential-side power supply, can be a different voltage depending on the circuits that constitute the circuit device 20. For example, a voltage obtained by a regulator of a power supply circuit provided in the circuit device 20 regulating a power supply voltage of VCC from the outside is supplied to each circuit as the VDD.

Gates of the P-type transistor TA1 and the N-type transistor TA2 are controlled based on the feedback clock signal FBCK. For example, in FIG. 5, a negative logic feedback clock signal XFBCK obtained by inverting the feedback clock signal FBCK is input to the gates of the transistors TA1 and TA2. The sampling circuit 32 includes the sampling switch circuit SS and the capacitor CS. The sampling switch circuit SS is provided between the output node NQ of the slope signal generation circuit 22 and the sampling node NS of the sampling voltage VSA, and is turned on or off based on the reference clock signal RFCK. For example, in FIG. 5, the sampling switch circuit SS includes an N-type transistor TA3, and a negative logic reference clock signal XRFCK obtained by inverting the reference clock signal RFCK is input to a gate of the N-type transistor TA3. Therefore, when the reference clock signal RFCK is at a low level which is an inactive level, the switch circuit SS is turned on, and when the reference clock signal RFCK is at a high level which is an active level, the switch circuit SS is turned off. One end of the sampling capacitor CS is coupled to the sampling node NS. Another end of the sampling capacitor CS is coupled to, for example, a node of a predetermined potential such as a GND node.

Figure 6:
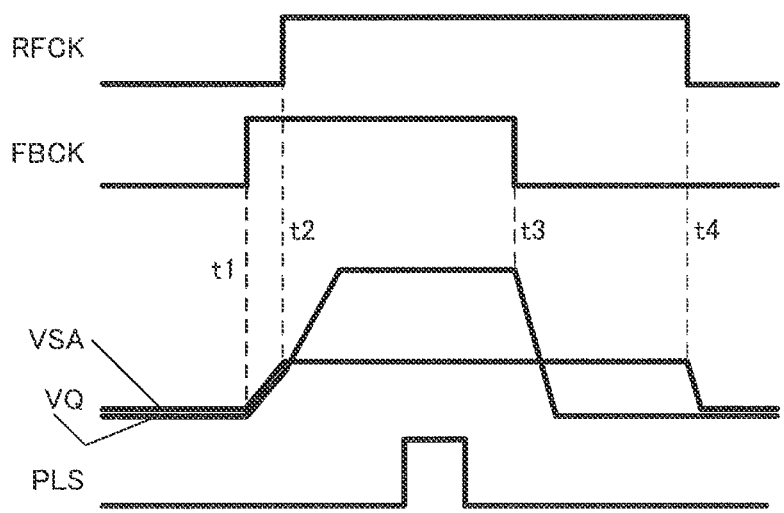
FIG. 6 is a signal waveform diagram showing an operation of the slope signal generation circuit and the first phase comparison circuit.

FIG. 6 is a signal waveform diagram showing an operation of the slope signal generation circuit 22 and the first phase comparison circuit 30. When the feedback clock signal FBCK changes from the low level to the high level at a timing t1 in FIG. 6, the P-type transistor TA1 of the slope signal generation circuit 22 is turned on, and a current flows from the VDD node to the output node NQ of the slope signal generation circuit 22 via the transistor TA1 and the variable resistor RA. At this time, since the reference clock signal RFCK is at the low level, the switch circuit SS including the N-type transistor TA3 is turned on, and the current from the output node NQ flows through the sampling capacitor CS and is charged, thereby increasing the output voltage VQ of the output node NQ with a predetermined slope. Accordingly, the slope signal SLP whose voltage changes with a predetermined slope is generated. At this time, a slope of the slope signal SLP, which is a slope of the output voltage VQ over time, can be set based on a resistance value of the variable resistor RA and capacitance of the capacitor CS. For example, when the resistance value of the variable resistor RA decreases or the capacitance of the capacitor CS decreases, the slope increases, and when the resistance value increases or the capacitance increases, the slope decreases. By increasing the slope of the slope signal SLP, a gain of the PLL loop increases, and thus the in-band noise can be reduced.

When the reference clock signal RFCK changes from the low level to the high level at a timing t2 in FIG. 6, the switch circuit SS including the N-type transistor TA3 is turned off. The output voltage VQ at the timing t2 at which the switch circuit SS is turned off is sampled at the sampling node NS as the sampling voltage VSA. In this case, the sampling voltage VSA increases as the timing t2 at which the reference clock signal RFCK is turned to the high level is delayed with respect to the timing t1 at which the feedback clock signal FBCK is turned to the high level. Therefore, the sampling voltage VSA is a voltage corresponding to the phase difference between the reference clock signal RFCK and the feedback clock signal FBCK, and the sampling voltage VSA increases as the phase difference increases. When the switch circuit SS is turned off, the sampling capacitor CS is decoupled from the output node NQ, so that the slope of the output voltage VQ increases. In a period during which the pulse signal PLS is at the high level, the sampling switch circuit SP in FIG. 2 is turned on. Accordingly, the charge pump current generated by the amplifier circuit AP performing voltage-current conversion on the sampling voltage VSA is input to the loop filter circuit 72 to generate a control voltage, and the frequency of the clock signal CK is controlled by the voltage controlled oscillation circuit 74. When the feedback clock signal FBCK is turned to the low level at a timing t3, the P-type transistor TA1 of the slope signal generation circuit 22 is turned off and the N-type transistor TA2 of the slope signal generation circuit 22 is turned on, thereby decreasing the output voltage VQ. When the reference clock signal RFCK is turned to the low level at a timing t4, the switch circuit SS is turned on, and the sampling voltage VSA is at a potential substantially same as that of the output voltage VQ.

As described above, the circuit device 20 according to the embodiment includes the slope signal generation circuit 22 that generates the slope signal SLP based on the reference clock signal RFCK. The sampling circuit 32 samples the slope signal SLP based on the reference clock signal RFCK. In this way, the slope signal generation circuit 22 generates the slope signal SLP having a predetermined slope, and the slope signal SLP is sampled based on the reference clock signal RFCK, thereby outputting the sampling voltage VSA. The sampling voltage VSA is a voltage corresponding to the phase difference between the reference clock signal RFCK and the feedback clock signal FBCK. Therefore, the first charge pump circuit 40 outputs a current corresponding to the sampling voltage VSA in the active period of the pulse signal PLS, thereby outputting a current corresponding to the phase difference between the reference clock signal RFCK and the feedback clock signal FBCK to the clock signal generation circuit 70. Accordingly, a sampling PLL circuit capable of reducing the in-band noise can be implemented, and the clock signal CK with reduced phase noise can be generated.

3. Dead Zone Detection Circuit

Figure 7:
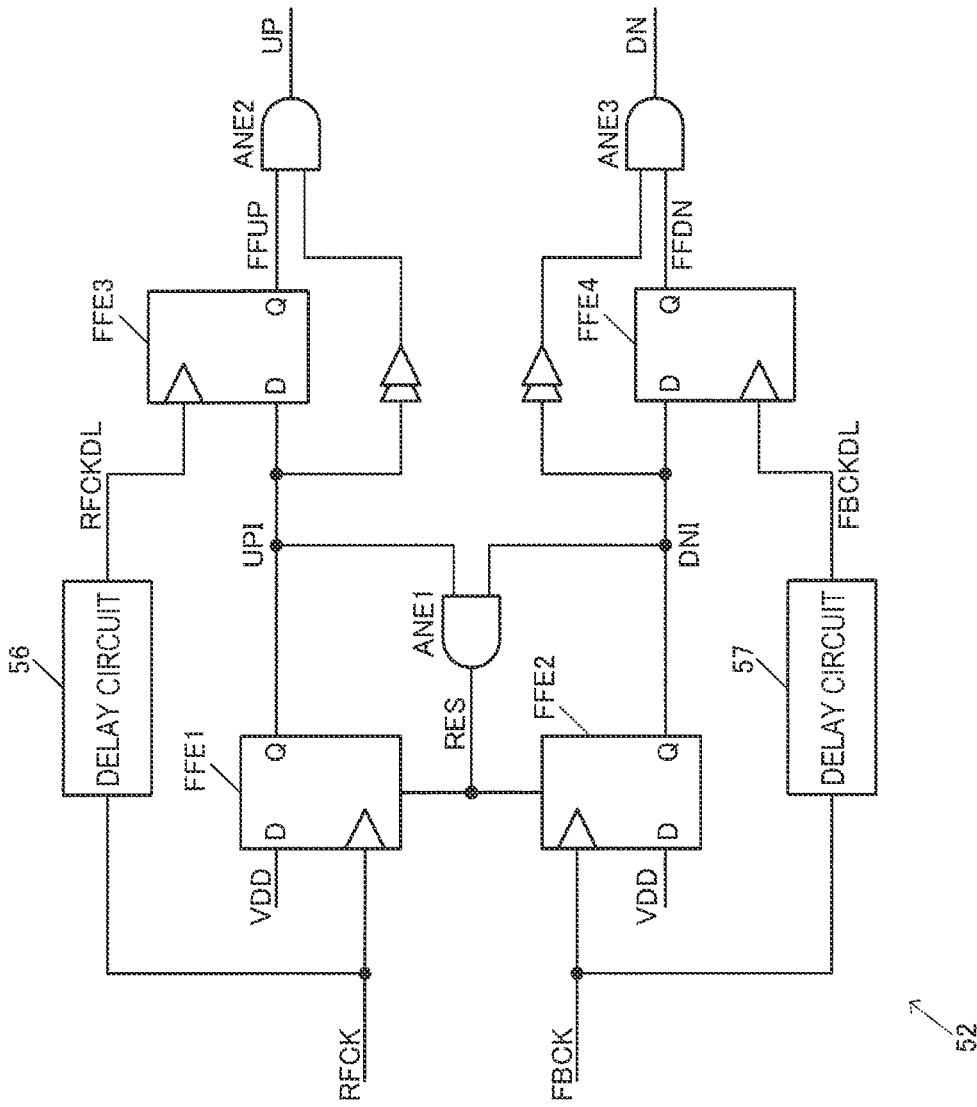
FIG. 7 shows a configuration example of a dead zone detection circuit.
Figure 8:
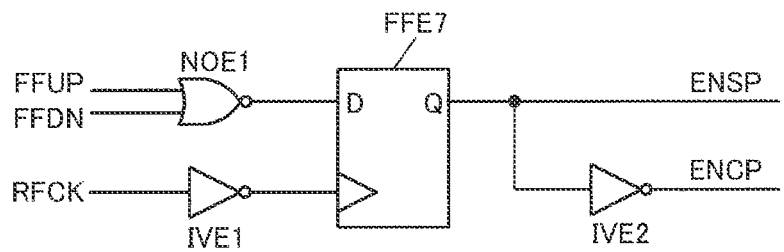
FIG. 8 shows a configuration example of an enable signal generation circuit.
Figure 9:
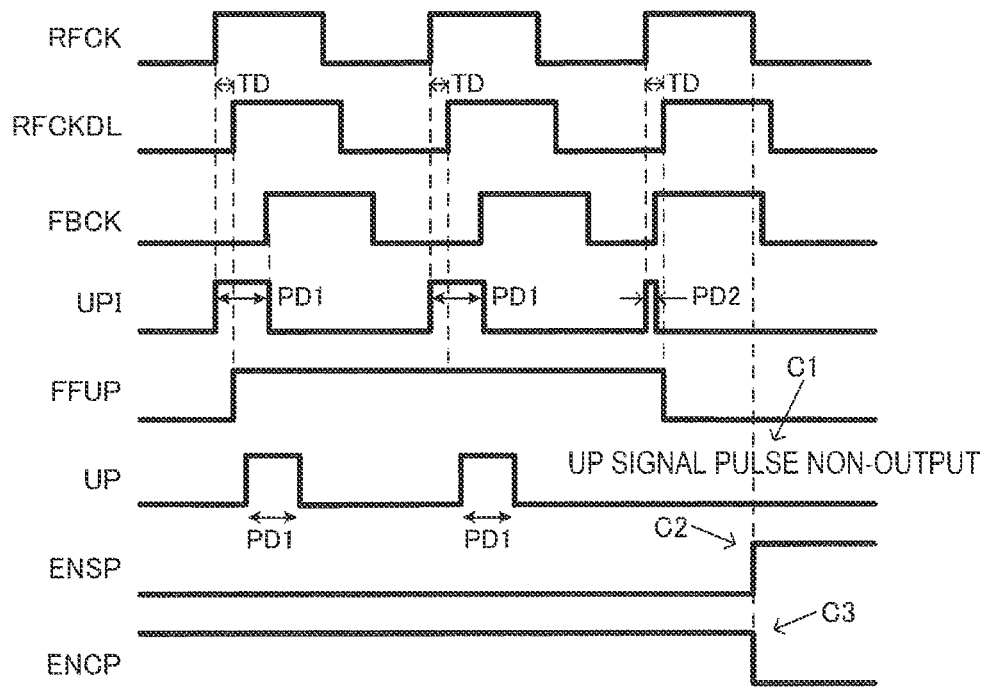
FIG. 9 a signal waveform diagram showing an operation of the dead zone detection circuit and the enable signal generation circuit.

FIG. 7 shows a configuration example of the dead zone detection circuit 52 in FIGS. 2 and 3. FIG. 8 shows a configuration example of the enable signal generation circuit 54. FIG. 9 is a signal waveform diagram showing an operation of these circuits.

As described in FIG. 2 and the like, the dead zone detection circuit 52 detects whether the phase difference between the reference clock signal RFCK and the feedback clock signal FBCK falls within the dead zone. When the dead zone detection circuit 52 detects that the phase difference does not fall within the dead zone, the second phase comparison circuit 50 outputs the phase difference signal PDS obtained based on the phase comparison between the reference clock signal RFCK and the feedback clock signal FBCK. In this way, when the phase difference does not fall within the dead zone, the phases and frequencies of the reference clock signal RFCK and the feedback clock signal FBCK can be brought closer to each other by the second synchronous operation in the second feedback loop. When the phase difference falls within the dead zone, the phases of the reference clock signal RFCK and the feedback clock signal FBCK can be brought closer to each other by the first synchronous operation in the first feedback loop. Accordingly, since the SPLL operation is performed in the first feedback loop having a large gain, the clock signal CK with reduced phase noise can be generated.

Specifically, the dead zone detection circuit 52 in FIG. 7 includes flip-flop circuits FFE1, FFE2, FFE3, and FFE4, AND circuits ANE1, ANE2, and ANE3, delay circuits 56 and 57, and the like. The flip-flop circuit FFE1 receives the VDD at a D terminal, receives the reference clock signal RFCK at a CK terminal, and outputs a signal UPI from a Q terminal. The flip-flop circuit FFE2 receives the VDD at a D terminal, receives the feedback clock signal FBCK at a CK terminal, and outputs a signal DNI from a Q terminal. The AND circuit ANE1 outputs, as a reset signal RES, a signal obtained by ANDing the signals UPI and DNI to reset terminals of the flip-flop circuits FFE1 and FFE2.

The delay circuit 56 outputs a signal RFCKDL obtained by delaying the reference clock signal RFCK, and the delay circuit 57 outputs a signal FBCKDL obtained by delaying the feedback clock signal FBCK. The flip-flop circuit FFE3 receives the signal UPI at a D terminal, receives the signal RFCKDL at a CK terminal, and outputs a signal FFUP from a Q terminal. The flip-flop circuit FFE4 receives the signal DNI at a D terminal, receives the signal FBCKDL at a CK terminal, and outputs a signal FFDN from a Q terminal. The AND circuit ANE2 outputs, as the up signal UP, a signal obtained by ANDing the signal FFUP and a signal obtained by delaying the signal UPI. The AND circuit ANE3 outputs, as the down signal DN, a signal obtained by ANDing the signal FFDN and a signal obtained by delaying the signal DNI.

As shown in FIG. 8, the enable signal generation circuit 54 includes a flip-flop circuit FFE7, a NOR circuit NOE1, and inverter circuits IVE1 and IVE2. The signals FFUP and FFDN are input to the NOR circuit NOE1. An output signal of the NOR circuit NOE1 is input to a D terminal of the flip-flop circuit FFE7, and a signal obtained by inverting the reference clock signal RFCK by the inverter circuit IVE1 is input to a CK terminal of the flip-flop circuit FFE7. The enable signal ENSP is output from a Q terminal of the flip-flop circuit FFE7. A signal obtained by inverting the enable signal ENSP by the inverter circuit IVE2 is output as the enable signal ENCP.

Next, an operation on an up side will be described with reference to FIG. 9. An operation on a down side is the same as that on the up side, and thus a detailed description thereof will be omitted.

When the reference clock signal RFCK changes from the low level to the high level, the signal UPI from the Q terminal of the flip-flop circuit FFE1 that receives the VDD at the D terminal and receives the reference clock signal RFCK at the CK terminal changes to the high level. The delay circuit 56 outputs the signal RFCKDL obtained by delaying the reference clock signal RFCK by a delay time TD. At a timing at which the signal RFCKDL changes from the low level to the high level, the signal FFUP from the Q terminal of the flip-flop circuit FFE3 that receives the high-level signal UPI at the D terminal and receives the signal RFCKDL at the CK terminal changes from the low level to the high level.

Thereafter, when the feedback clock signal FBCK changes from the low level to the high level, the signal DNI from the Q terminal of the flip-flop circuit FFE2 that receives the VDD at the D terminal and receives the feedback clock signal FBCK at the CK terminal changes to the high level. Accordingly, the reset signal RES output from the AND circuit ANE1 to which the high-level signal UPI and the high-level signal DNI are input is at the high level, and the flip-flop circuit FFE1 is reset, so that the signal UPI changes from the high level to the low level. In this way, the signal UPI having a pulse width PD1 is generated. A length of the pulse width PD1 corresponds to the phase difference between the reference clock signal RFCK and the feedback clock signal FBCK. A signal obtained by ANDing the signal FFUP and the signal obtained by delaying the signal UPI is output as the up signal UP having the pulse width PD1.

When the phase difference between the reference clock signal RFCK and the feedback clock signal FBCK decreases due to the second synchronous operation in the second feedback loop, the pulse width of the signal UPI also decreases to a pulse width PD2 as shown in FIG. 9. For example, in FIG. 9, the phase difference between the reference clock signal RFCK and the feedback clock signal FBCK is smaller than the delay time TD in the delay circuit 56. That is, the pulse width PD2 of the signal UPI corresponding to the phase difference is smaller than the delay time TD. In this case, a signal obtained by ANDing the signal FFUP and the signal obtained by delaying the signal UPI in the AND circuit ANE2 is at the low level, and a pulse of the up signal UP is not output, as indicated by C1 in FIG. 9. That is, it is detected that the phase difference between the reference clock signal RFCK and the feedback clock signal FBCK falls within the dead zone, and the pulse of the up signal UP is not output.

In C1 in FIG. 9, since the signals FFUP and FFDN are both at the low level, the enable signal ENSP output from the Q terminal of the flip-flop circuit FFE7 in FIG. 8 changes from the low level to the high level, as indicated by C2 when the reference clock signal RFCK changes from the high level to the low level. Accordingly, the SPLL operation, which is the first synchronous operation in the first feedback loop including the first phase comparison circuit 30, the first charge pump circuit 40, and the clock signal generation circuit 70, is enabled. As indicated by C3, the enable signal ENCP changes from the high level to the low level. Accordingly, the operation of the second charge pump circuit 60 is set disabled or in the low power consumption mode.

As described above, in the dead zone detection circuit 52 in FIG. 7, when the phase difference between the reference clock signal RFCK and the feedback clock signal FBCK is larger than the delay time TD in the delay circuits 56 and 57, it is detected that the phase difference does not fall within the dead zone, and thus the pulses of the up signal UP and the down signal DN are output. Accordingly, the FLL operation, which is the second synchronous operation in the second feedback loop including the second phase comparison circuit 50, the second charge pump circuit 60, and the clock signal generation circuit 70, is performed.

By the FLL operation, the phase difference between the reference clock signal RFCK and the feedback clock signal FBCK is smaller than the delay time TD in the delay circuits 56 and 57, and the pulse of the up signal UP is not output, as indicated by C1 in FIG. 9 when it is detected that the phase difference falls within the dead zone. Accordingly, the FLL operation in the second feedback loop is not performed. As indicated by C2, the enable signal ENSP is turned to the high level, and the SPLL operation in the first feedback loop is started. Accordingly, by the operation of the SPLL having a large loop gain, the phase synchronization is performed to further bring the phases of the reference clock signal RFCK and the feedback clock signal FBCK closer to each other, and thus the clock signal CK with reduced phase noise can be generated.

4. Pulser Circuit

Figure 10:
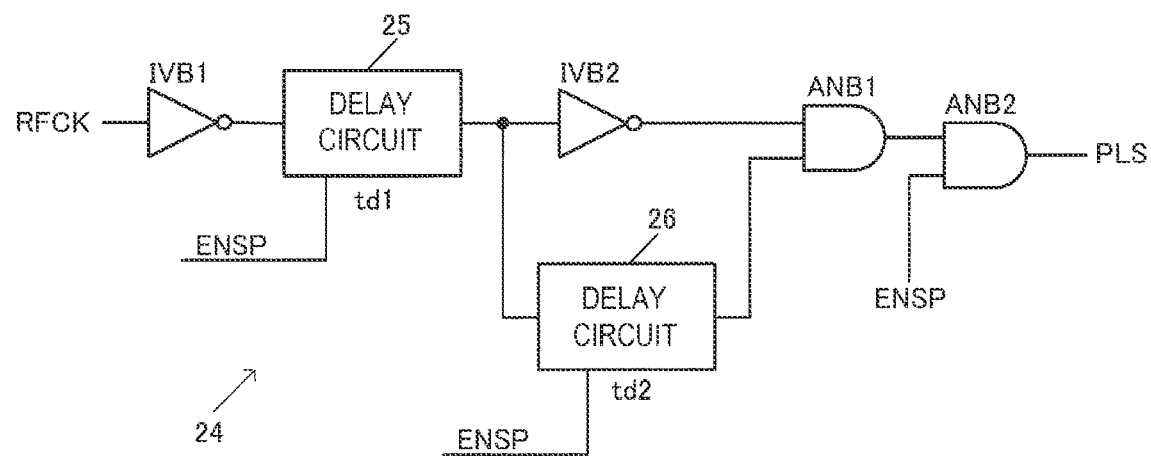
FIG. 10 shows a configuration example of a pulser circuit.
Figure 11:
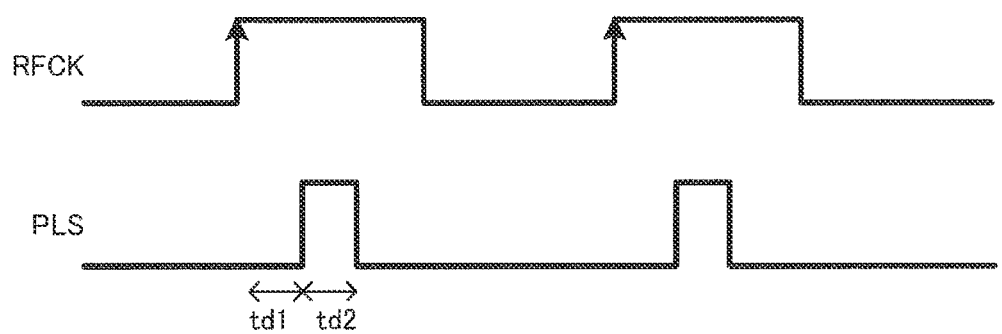
FIG. 11 is a signal waveform diagram showing an operation of the pulser circuit.

FIG. 10 shows a configuration example of the pulser circuit 24. FIG. 11 is a signal waveform diagram showing the operation of the pulser circuit 24.

The pulser circuit 24 in FIG. 10 includes delay circuits 25 and 26, inverter circuits IVB1 and IVB2, and AND circuits ANB1 and ANB2. A signal obtained by inverting the reference clock signal RFCK by the inverter circuit IVB1 is input to the delay circuit 25. A signal delayed by a delay time td1 by the delay circuit 25 is input to the delay circuit 26 and the inverter circuit IVB2. A signal delayed by a delay time td2 by the delay circuit 26 and an output signal of the inverter circuit IVB2 are input to the AND circuit ANB1. An output signal of the AND circuit ANB1 and the enable signal ENSP are input to the AND circuit ANB2, and the AND circuit ANB2 outputs the pulse signal PLS.

Thus, as shown in FIG. 11, after the reference clock signal RFCK changes from the low level to the high level, the pulse signal PLS can be generated which changes from the low level to the high level after the delay time td1 has passed, and then changes from the high level to the low level after the delay time td2 has passed. The delay times td1 and td2 of the signals in the delay circuits 25 and 26 can be variably adjusted. By adjusting the delay times td1 and td2 in this way, a timing at which the pulse signal PLS is turned to the high level and a pulse width of the pulse signal PLS can be adjusted after the reference clock signal RFCK is turned to the high level.

In FIG. 10, the enable signal ENSP is input to another terminal of the AND circuit ANB2 that receives an output signal of the AND circuit ANB1 at one input terminal. Accordingly, the pulse signal PLS is output when the enable signal ENSP is at the high level, which is an active level. Therefore, when the enable signal ENSP is at the high level in the dead zone period in FIG. 4, the pulse signal PLS is output from the pulser circuit 24. Accordingly, the SPLL operation is performed in the first feedback loop including the first phase comparison circuit 30, the first charge pump circuit 40, and the clock signal generation circuit 70. On the other hand, when the enable signal ENSP is at the low level, which is an inactive level, the pulse signal PLS output from the AND circuit ANB2 is fixed to the low level. Therefore, when the enable signal ENSP is at the low level in the non-dead zone period in FIG. 4, the pulse signal PLS from the pulser circuit 24 is not output, and the SPLL operation is not performed in the first feedback loop.

In FIG. 10, for example, the enable signal ENSP is also input to the delay circuits 25 and 26. When the enable signal ENSP is at the high level, the delay circuits 25 and 26 perform a signal delay operation, which is a normal operation. Accordingly, the operation of the pulser circuit 24 is enabled. On the other hand, when the enable signal ENSP is at the low level, the delay circuits 25 and 26 are disabled, and the operation of the pulser circuit 24 is also disabled.

For example, each of the delay circuits 25 and 26 includes a current source and a capacitor whose capacitance charged by a bias current from the current source is variable, and the delay times td1 and td2 in FIG. 11 which are delay amounts are set by the bias current and the capacitance of the capacitor. For example, the delay times td1 and td2 are controlled by controlling the capacitances of the capacitors. For example, when the enable signal ENSP is at the low level, the bias current from the current source is prevented from flowing through a current path. In this way, the delay circuits 25 and 26 are disabled, and the operation of the pulser circuit 24 is also disabled. By preventing the bias current from the current source from flowing through the current path, the low power consumption mode of the delay circuits 25 and 26 can be implemented, and the pulser circuit 24 can be set in the low power consumption mode in the non-dead zone period. In this case, the low power consumption mode may be implemented by restricting the bias current flowing through the current source instead of completely cutting off the bias current so as not to flow.

5. Second Charge Pump Circuit

Figure 12:
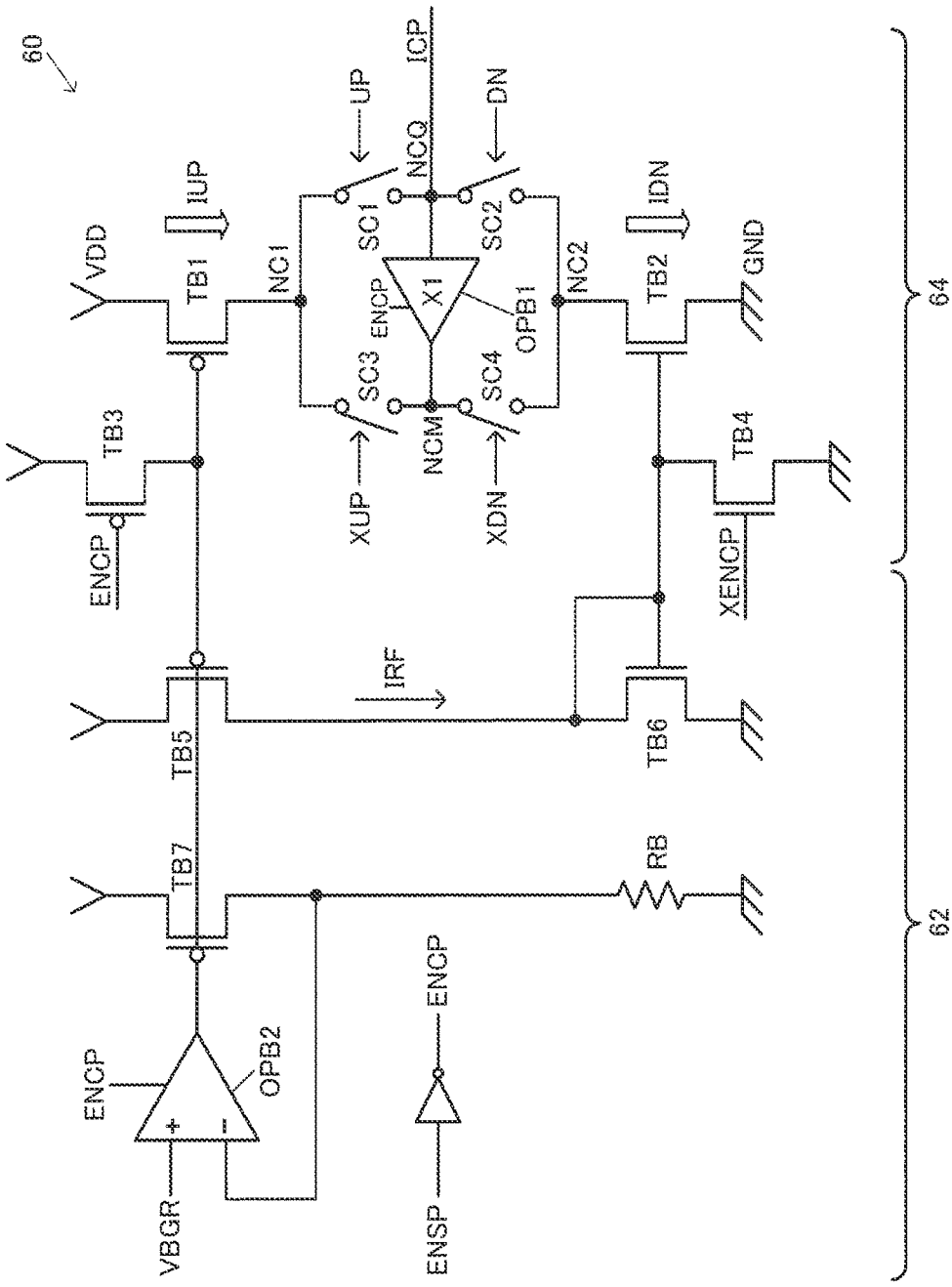
FIG. 12 shows a configuration example of a second charge pump circuit.

FIG. 12 shows a configuration example of the second charge pump circuit 60. As shown in FIG. 12, the second charge pump circuit 60 includes a reference current generation circuit 62 and a current output circuit 64. The reference current generation circuit 62 generates a reference current IRF based on a reference voltage VBGR. The reference voltage VBGR is, for example, a bandgap reference voltage. The current output circuit 64 outputs, based on the up signal UP or the down signal DN from the second phase comparison circuit 50, a charge pump current ICP which is based on a mirror current of the reference current IRF. For example, the current output circuit 64 outputs the charge pump current ICP which is based on a current obtained by mirroring the reference current IRF by a current mirror circuit. As described above, the reference current generation circuit 62 generates the reference current IRF based on the reference voltage VBGR, so that the reference current IRF that is maintained constant with respect to a change in a power supply voltage, a temperature, or the like can be generated. The charge pump current ICP which is based on the mirror current of the reference current IRF is output based on the up signal UP or the down signal DN, so that the charge pump current ICP that is maintained constant with respect to the change in the power supply voltage, the temperature, and the like can be output to the clock signal generation circuit 70. Accordingly, an appropriate frequency control of the clock signal CK which is based on the charge pump current ICP can be implemented.

In the embodiment, the reference current IRF and the mirror current of the reference current IRF are cut off in the dead zone period. For example, in FIG. 4, when the phase difference between the reference clock signal RFCK and the feedback clock signal FBCK falls within the dead zone and the FLL operation is switched to the SPLL operation, the reference current IRF and the mirror current thereof in the second charge pump circuit 60 are cut off. In this way, it is possible to prevent the reference current IRF and the mirror current thereof from flowing unnecessarily in the second charge pump circuit 60, which does not need to operate in the dead zone period, thereby preventing power consumption. Accordingly, the low power consumption of the circuit device 20 can be implemented.

Specifically, in FIG. 12, the reference current generation circuit 62 includes an operational amplifier OPB2, a P-type transistor TB7 and a resistor RB that are provided in series between the VDD node and the GND node, and a P-type transistor TB5 and an N-type transistor TB6 that are provided in series between the VDD node and the GND node. The operational amplifier OPB2 receives the reference voltage VBGR at a non-inverting input terminal. An inverting input terminal of the operational amplifier OPB2 is coupled to a connection node between the transistor TB7 and the resistor RB. An output signal of the operational amplifier OPB2 is input to gates of transistors TB7, TB5, and TB1. A drain of the transistor TB5 is coupled to a drain and a gate of the transistor TB6. The reference current generation circuit 62 having such a configuration can generate the reference current IRF which is based on the reference voltage VBGR.

The current output circuit 64 includes the P-type transistor TB1, a first switch SC1, a second switch SC2, and an N-type transistor TB2.

The P-type transistor TB1 is provided between a first node NC1 and the VDD node which is the high-potential-side power supply node, and an up current IUP flows as the charge pump current ICP. For example, the up current IUP generated by mirroring the reference current IRF by a current mirror circuit of the transistors TB5 and TB1 flows through the transistor TB1. The first switch SC1 is provided between the first node NC1 and an output node NCQ of the current output circuit 64, and is turned on when the up signal UP is active. The up signal UP is input to the second charge pump circuit 60 as the phase difference signal PDS from the second phase comparison circuit 50 in a previous stage.

The N-type transistor TB2 is provided between a second node NC2 and the GND node which is the low-potential-side power supply node, and a down current IDN flows as the charge pump current ICP. For example, the down current IDN generated by mirroring the reference current IRF by a current mirror circuit of the transistors TB6 and TB2 flows through the transistor TB2. The second switch SC2 is provided between the output node NCQ and the second node NC2, and is turned on when the down signal DN is active. The down signal DN is input to the second charge pump circuit 60 as the phase difference signal PDS from the second phase comparison circuit 50 in the previous stage.

In this way, when the up signal UP from the second phase comparison circuit 50 is active, the first switch SC1 is turned on, so that the up current IUP can flow as the charge pump current ICP which is based on the mirror current of the reference current IRF. When the down signal DN from the second phase comparison circuit 50 is active, the second switch SC2 is turned on, so that the down current IDN can flow as the charge pump current ICP which is based on the mirror current of the reference current IRF. Accordingly, the charge pump current ICP corresponding to the phase difference between the reference clock signal RFCK and the feedback clock signal FBCK is output to the clock signal generation circuit 70, and thus a frequency control of the clock signal CK corresponding to the phase difference can be implemented.

As shown in FIG. 12, the current output circuit 64 further includes a third switch SC3, a fourth switch SC4, and an operational amplifier OPB1.

The third switch SC3 is provided between the first node NC1 and a mirror node NCM of the output node NCQ, and is turned on when the up signal UP is inactive. That is, the third switch SC3 is turned on when a signal XUP, which is a negative logic signal of the up signal UP, is active. The fourth switch SC4 is provided between the mirror node NCM and the second node NC2, and is turned on when the down signal DN is inactive. That is, the fourth switch SC4 is turned on when a signal XDN, which is a negative logic signal of the down signal DN, is active. The operational amplifier OPB1 is a voltage-follower-connected operational amplifier whose input terminal is coupled to the output node NCQ and output terminal is coupled to the mirror node NCM. For example, the operational amplifier OPB1 has a voltage-follower-connection in which an inverting input terminal and an output terminal are coupled, and a non-inverting input terminal of the operational amplifier OPB1 is coupled to the output node NCQ.

In this way, the third switch SC3 and the fourth switch SC4 serving as mirror circuits of the first switch SC1 and the second switch SC2 are provided between the first node NC1 and the second node NC2. A voltage of the mirror node NCM between the third switch SC3 and the fourth switch SC4 can be set to a voltage the same as that of the output node NCQ between the first switch SC1 and the second switch SC2 by the voltage-follower-connected operational amplifier OPB1, and a bootstrap operation can be performed. Therefore, when the up signal UP is active, and an ON-OFF state where the up signal UP is active and the first switch SC1 is turned on and the second switch SC2 is turned off is changed to an OFF-OFF state where both the first switch SC1 and the second switch SC2 are turned off, the third switch SC3 and the fourth switch SC4 are turned on, so that the voltage of the mirror node NCM can be maintained at a voltage of the output node NCQ. Accordingly, it is possible to prevent the voltage of the first node NC1 from being the voltage of the VDD and the voltage of the second node NC2 from being the voltage of the GND during the OFF-OFF state described above, and when the first switch SC1 or the second switch SC2 is turned on next time, the appropriate up current IUP or down current IDN can flow.

Similarly, when the down signal DN is active, and an OFF-ON state where the first switch SC1 is turned off and the second switch SC2 is turned on is changed to an OFF-OFF state where the first switch SC1 and the second switch SC2 are turned off, the third switch SC3 and the fourth switch SC4 are turned on, so that the voltage of the mirror node NCM can be maintained at the voltage of the output node NCQ. Accordingly, it is possible to prevent the voltage of the first node NC1 from being the voltage of the VDD and the voltage of the second node NC2 from being the voltage of the GND during the OFF-OFF state described above, and when the first switch SC1 or the second switch SC2 is turned on next time, the appropriate up current IUP or down current IDN can flow.

In FIG. 12, a P-type transistor TB3 whose drain is coupled to the gates of the transistors TB1 and TB5 and source is coupled to the VDD node, and that receives the enable signal ENCP at a gate is provided. In addition, an N-type transistor TB4 whose drain is coupled to the gates of the transistors TB2 and TB6 and source is coupled to the GND node, and that receives a negative logic enable signal XENCP at a gate is provided. The enable signal ENCP is input to the operational amplifiers OPB1 and OPB2. Here, the enable signal ENCP is, for example, a signal obtained by inverting the enable signal ENSP by an inverter.

In this way, for example, when the enable signal ENSP is at the high level and the enable signal ENCP is at the low level in the dead zone period, the P-type transistor TB3 that receives the enable signal ENCP at the gate and the N-type transistor TB4 that receives the negative logic enable signal XENCP at the gate are turned on. Accordingly, the gates of the P-type transistors TB1 and TB5 are set to the VDD, the gates of the N-type transistors TB2 and TB6 are set to the GND, and the reference current IRF and the mirror current of the reference current IRF are cut off and stop flowing. In addition, the up current IUP and the down current IDN which are based on the mirror current are also cut off and stop flowing. When the enable signal ENSP is at the high level and the enable signal ENCP is at the low level, the operational amplifiers OPB1 and OPB2 are disabled. In this way, the reference current IRF and the mirror current thereof are cut off, and the operational amplifiers OPB1 and OPB2 are disabled, so that the operation of the second charge pump circuit 60 is disabled. The reference current IRF and the mirror current stop flowing and the operational amplifiers OPB1 and OPB2 are disabled, so that a useless current stops flowing, and the low power consumption mode can be implemented. The low power consumption mode may be implemented by restricting the current instead of completely cutting off the reference current IRF and the mirror current.

As described above, in FIG. 12, when it is detected that the phase difference falls within the dead zone and the operation shifts from the FLL operation to the SPLL operation, the reference current IRF and the mirror current thereof in the second charge pump circuit 60 are cut off, so that the second charge pump circuit 60 can be set disabled or in the low power consumption mode. Therefore, in the SPLL operation in the dead zone period, unnecessary power consumption due to an unnecessary current flow in the second charge pump circuit 60 can be prevented, and the low power consumption of the circuit device 20 can be implemented.

6. Hysteresis of Dead Zone Width

Figure 13:
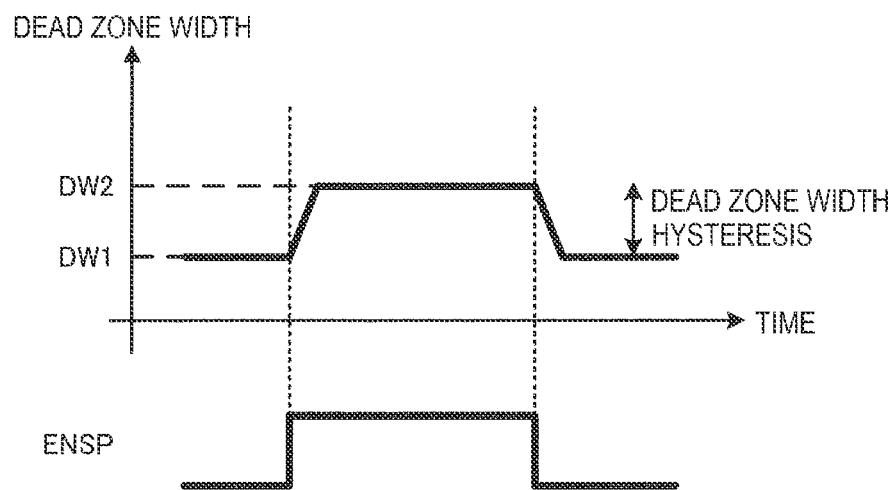
FIG. 13 is a diagram showing a method of setting two dead zone widths.

In the embodiment, a width of the dead zone may have hysteresis. For example, as shown in FIG. 13, when it is detected that the phase difference falls within the dead zone and the enable signal ENSP is at the high level, a dead zone width is changed from a first dead zone width DW1 to a second dead zone width DW2 that is larger than DW1. Specifically, after it is detected that the phase difference between the reference clock signal RFCK and the feedback clock signal FBCK falls within the dead zone having the first dead zone width DW1, the dead zone detection circuit 52 sets the dead zone to have the second dead zone width DW2 that is larger than the first dead zone width DW1. In this way, when it is detected that the phase difference falls within the dead zone having the first dead zone width DW1, the width of the dead zone is changed to the second dead zone width DW2 that is larger than DW1. Therefore, even when the phase difference increases due to noise or the like after falling within the dead zone, the phase difference can be prevented from being erroneously determined as not falling within the dead zone. That is, a situation where the FLL operation and the SPLL operation are frequently switched such that when the phase difference falls within the dead zone, the FLL operation is switched to the SPLL operation, and then when the phase difference does not fall within the dead zone due to the phase difference increasing, the SPLL operation is switched to the FLL operation can be prevented.

For example, the dead zone width is set by the delay time TD of the delay circuits 56 and 57 described with reference to FIGS. 7 and 9. When the delay time TD is small, the dead zone width is small, and when the delay time TD is large, the dead zone width is large. Therefore, the dead zone detection circuit 52 sets the delay time TD of the delay circuits 56 and 57 to, for example, the delay time TD1 corresponding to the first dead zone width DW1, and detects whether the phase difference falls within the dead zone. After it is detected that the phase difference falls within the dead zone having the first dead zone width DW1 corresponding to the delay time TD1, the dead zone detection circuit 52 sets the delay time TD of the delay circuits 56 and 57 to a delay time TD2 larger than the delay time TD1. Accordingly, the dead zone is set to have the second dead zone width DW2 larger than the first dead zone width DW1. Therefore, even when the phase difference increases due to noise or the like after it is detected that the phase difference falls within the dead zone, the phase difference can be prevented from being erroneously determined as not falling within the dead zone since the dead zone is set to have the wide second dead zone width DW2. Therefore, the situation where the FLL operation and the SPLL operation are frequently switched can be prevented.

Figure 14:
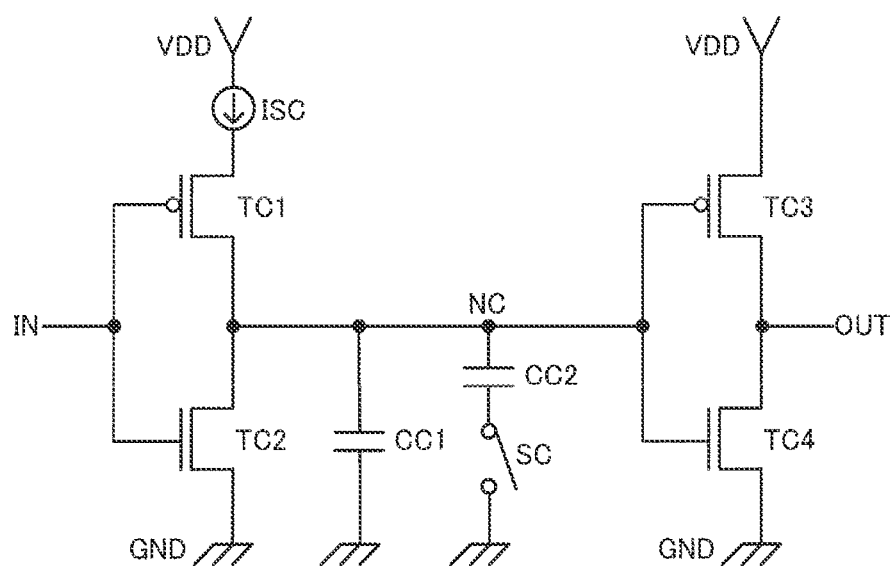
FIG. 14 shows a configuration example of a delay circuit of the dead zone detection circuit.

For example, FIG. 14 shows a configuration example of the delay circuits 56 and 57. In FIG. 14, one ends of capacitors CC1 and CC2 are coupled to a connection node NC between a first-stage inverter circuit including a current source ISC and transistors TC1 and TC2 and a second-stage inverter circuit including transistors TC3 and TC4. Another end of the capacitor CC1 is coupled to the GND node, another end of the capacitor CC2 is coupled to one end of a switch SC, and another end of the switch SC is coupled to the GND node.

When the delay time TD is set to TD1 and the dead zone is set to have the first dead zone width DW1, the switch SC is turned off. Accordingly, the delay time TD of the delay circuits 56 and 57 is set to the delay time TD1 determined by a current of the current source ISC and capacitance of the capacitor CC1.

On the other hand, when the dead zone is set to have the second dead zone width DW2, the switch SC is turned on. Accordingly, the delay time TD of the delay circuits 56 and 57 is set to the delay time TD2 determined by the current of the current source ISC and the capacitance of the capacitor CC1 and the capacitor CC2. Accordingly, the capacitance at the connection node NC increases, so that the delay time TD2 is longer than the delay time TD1. Therefore, the second dead zone width DW2 can be set larger than the first dead zone width DW1, and the dead zone width can have hysteresis.

7. Reset Time of Second Charge Pump Circuit

Figure 15:
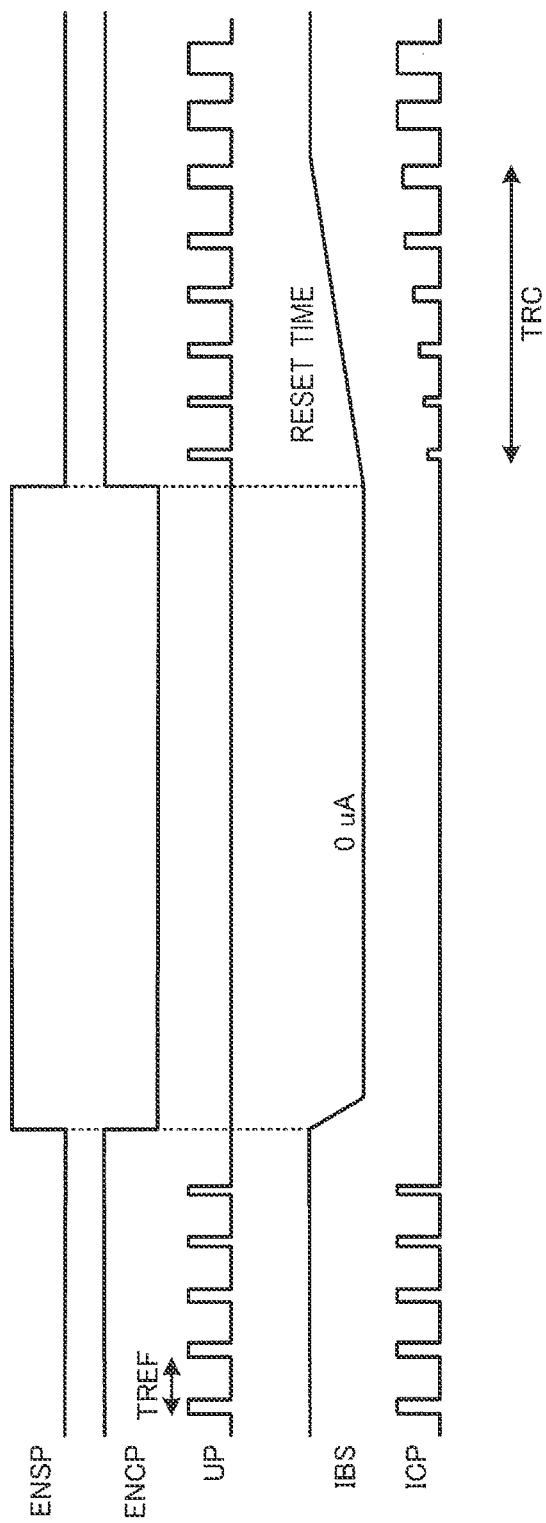
FIG. 15 is a diagram showing a reset operation of the second charge pump circuit.

In FIG. 15, the enable signal ENCP is at the high level, and the enabled second charge pump circuit 60 outputs the charge pump current ICP based on the up signal UP, thereby performing the FLL operation. Thereafter, the enable signal ENSP is turned to the high level and the enable signal ENCP is turned to the low level, so that the second charge pump circuit 60 is disabled. When the second charge pump circuit 60 is disabled in this manner, a bias current IBS flowing through the second charge pump circuit 60 is also cut off. Thereafter, the enable signal ENSP is turned to the low level and the enable signal ENCP is turned to the high level, so that the second charge pump circuit 60 is enabled from disabled. In this case, since the second charge pump circuit 60 is an analog circuit, a reset time TRC is long until the bias current IBS increases and the second charge pump circuit 60 is reset to an appropriate operation state where the stable charge pump current ICP is output. When the reset time TRC of the second charge pump circuit 60 increases, a time until the appropriate FLL operation is started increases.

Figure 16:
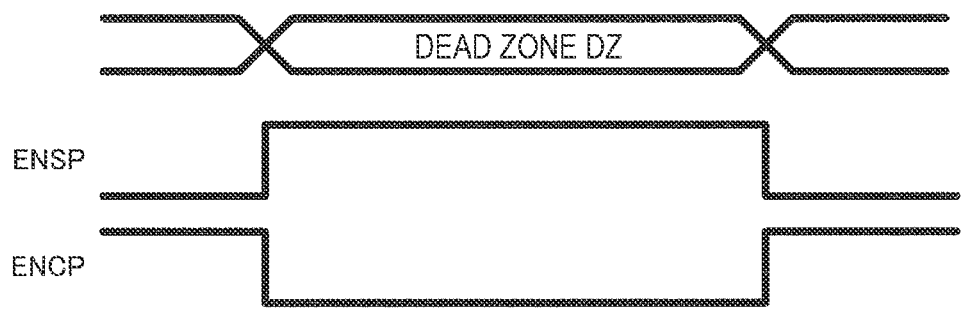
FIG. 16 is a diagram showing a method of setting a dead zone using two enable signals.
Figure 17:
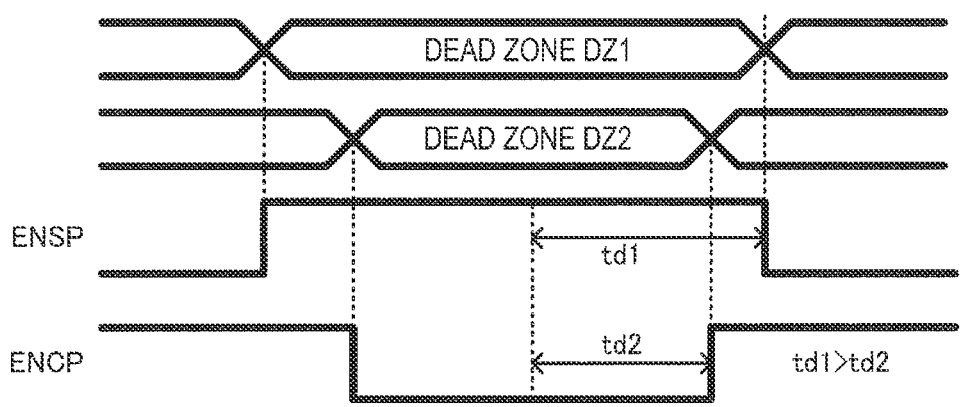
FIG. 17 is a diagram showing a method of setting a dead zone using two enable signals.

In order to prevent such a problem, a method of providing two dead zones DZ1 and DZ2 as shown in FIG. 17 is employed instead of providing only one dead zone DZ as shown in FIG. 16. That is, a method of providing a double dead zone is adopted. Specifically, instead of making the enable signal ENCP of the second charge pump circuit 60 a simple inverted signal of the enable signal ENSP as shown in FIG. 8, the enable signal ENCP and the enable signal ENSP are made to be signals that change at different timings.

Specifically, the circuit device 20 includes the pulser circuit 24 that outputs the pulse signal PLS based on the reference clock signal RFCK, and the second phase comparison circuit 50 includes the enable signal generation circuit 54. The enable signal generation circuit 54 generates the enable signal ENSP that is active in the dead zone period, and outputs the enable signal ENSP to the pulser circuit 24. In this case, the enable signal ENSP is a first enable signal. The enable signal generation circuit 54 generates the enable signal ENCP that is active in the non-dead zone period during which the phase difference does not fall within the dead zone, and outputs the enable signal ENCP to the second charge pump circuit 60. In this case, the enable signal ENCP is a second enable signal.

As shown in FIG. 17, when the non-dead zone period is switched to the dead zone period, the enable signal ENSP, which is the first enable signal, changes from inactive to active, and then the enable signal ENCP, which is the second enable signal, changes from active to inactive. That is, the enable signal generation circuit 54 generates the enable signals ENSP and ENCP such that the enable signal ENCP changes from the high level to the low level after the enable signal ENSP changes from the low level to the high level.

On the other hand, when the dead zone period is switched to the non-dead zone period, the enable signal ENSP, which is the first enable signal, changes from active to inactive after the enable signal ENCP, which is the second enable signal, changes from inactive to active. That is, the enable signal generation circuit 54 generates the enable signals ENSP and ENCP such that the enable signal ENSP changes from the high level to the low level after the enable signal ENCP changes from the low level to the high level. For example, as shown in FIG. 17, when the enable signal ENCP changes from the low level to the high level after the delay time td2, the enable signal ENSP changes from the high level to the low level after the delay time td1 longer than the delay time td2. Accordingly, the dead zone DZ1 based on the enable signal ENSP and the dead zone DZ2 based on the enable signal ENCP are set.

In this way, when the second charge pump circuit 60 is enabled and then is reset after being disabled as shown in FIG. 15, the enable signal ENCP changes from the low level to the high level before the enable signal ENSP changes from the high level to the low level as shown in FIG. 17. Accordingly, the enable signal ENCP changes to the high level, which is the active level, at an early timing, and thus the second charge pump circuit 60 can be enabled and reset at the early timing. Therefore, even when the reset time TRC is long until the second charge pump circuit 60 outputs an appropriate charge pump current, the operation of the second charge pump circuit 60 can be reset at the early timing to start the FLL operation.

Figure 18:
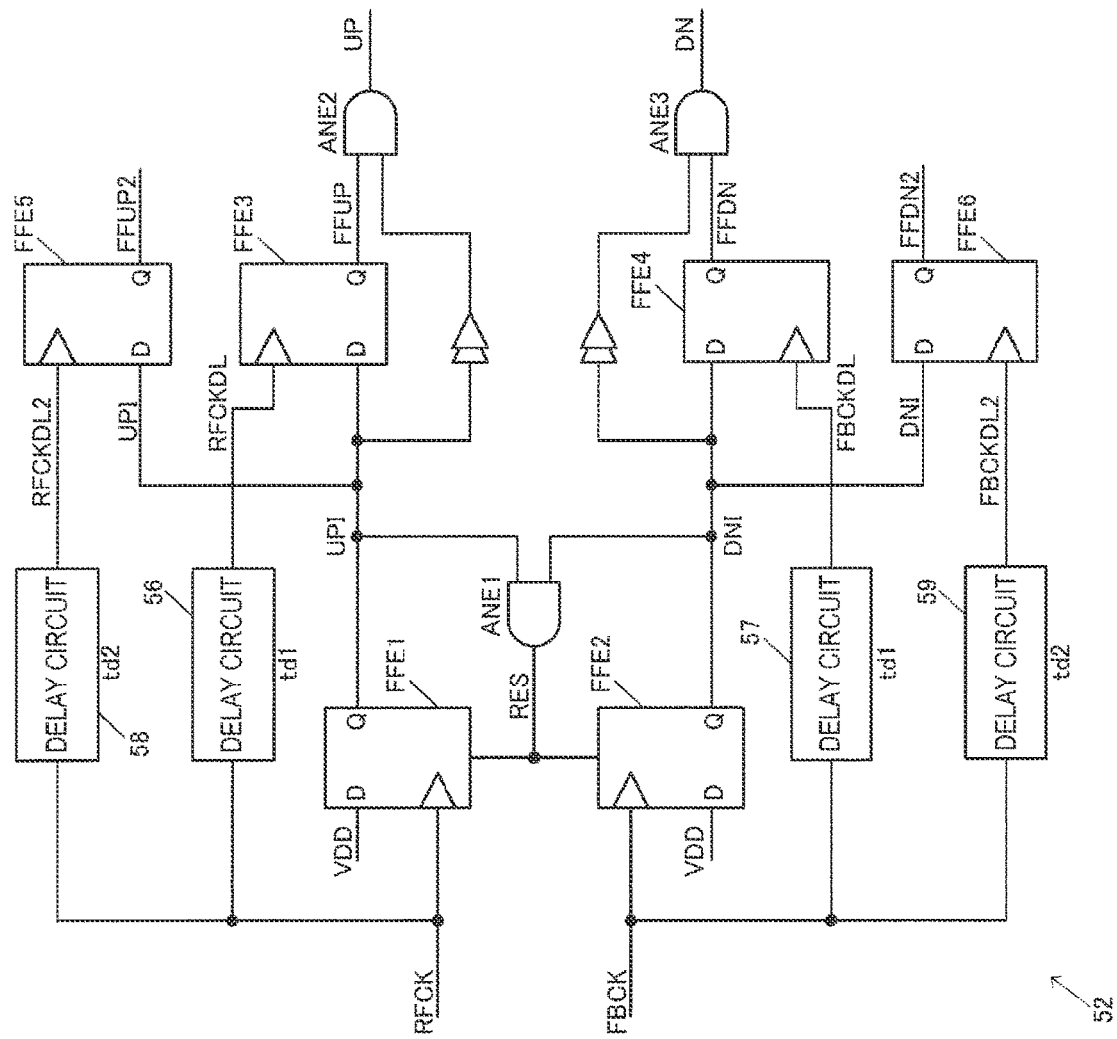
FIG. 18 shows another configuration example of the dead zone detection circuit.
Figure 19:
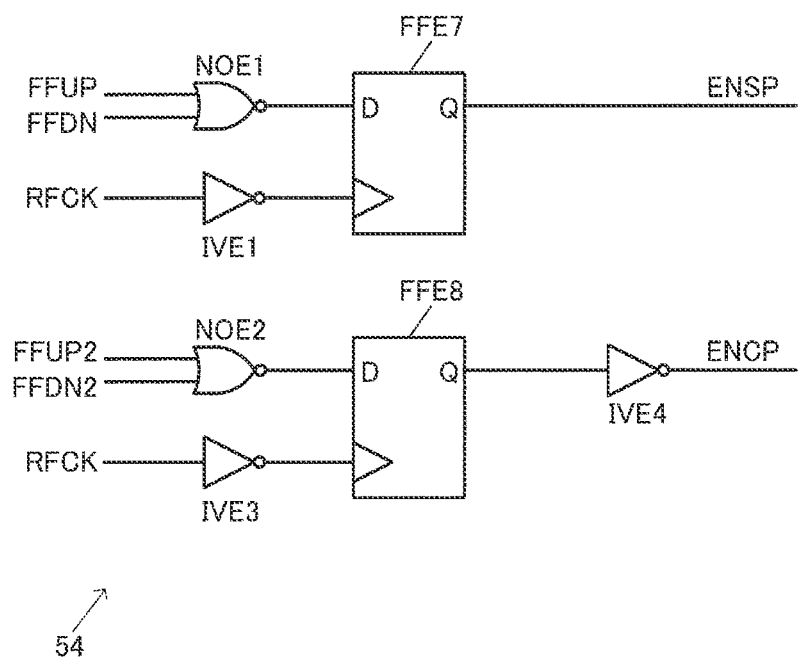
FIG. 19 shows another configuration example of the enable signal generation circuit.

FIGS. 18 and 19 show configuration examples of the dead zone detection circuit 52 and the enable signal generation circuit 54 when the method in FIG. 17 is adopted. In the dead zone detection circuit 52 in FIG. 18, delay circuits 58 and 59 and flip-flop circuits FFE5 and FFE6 are provided in addition to the configuration in FIG. 7.

The delay circuit 56 outputs the signal RFCKDL obtained by delaying the reference clock signal RFCK by the delay time td1. On the other hand, the delay circuit 58 outputs a signal RFCKDL2 obtained by delaying the reference clock signal RFCK by the delay time td2. The delay circuit 57 outputs the signal FBCKDL obtained by delaying the feedback clock signal FBCK by the delay time td1. On the other hand, the delay circuit 59 outputs the signal RFCKDL2 obtained by delaying the feedback clock signal FBCK by the delay time td2. As shown in FIG. 17, td1>td2 is satisfied between the delay times td1 and td2.

The flip-flop circuit FFE5 receives the signal UPI at a D terminal, receives the signal RFCKDL2 from the delay circuit 58 at a CK terminal, and outputs the signal FFUP2 from a Q terminal. The flip-flop circuit FFE6 receives the signal DNI at a D terminal, receives the signal FBCKDL2 from the delay circuit 59 at a CK terminal, and outputs the signal FFDN2 from a Q terminal.

As shown in FIG. 19, the enable signal generation circuit 54 includes a flip-flop circuit FFE8, a NOR circuit NOE2, and inverter circuits IVE3 and IVE4 in addition to the flip-flop circuit FFE7, the NOR circuit NOE1, and the inverter circuit IVE1 shown in FIG. 8. Signals FFUP2 and FFDN2 from the flip-flop circuits FFE5 and FFE6 in FIG. 18 are input to the NOR circuit NOE2. An output signal of the NOR circuit NOE2 is input to the D terminal of the flip-flop circuit FFE8, and a signal obtained by inverting the reference clock signal RFCK by the inverter circuit IVE3 is input to a CK terminal of the flip-flop circuit FFE8. A signal obtained by inverting a signal from the Q terminal of the flip-flop circuit FFE8 by the inverter circuit IVE4 is output as the enable signal ENCP.

In this way, the enable signal ENCP of the second charge pump circuit 60 can be generated not as a simple inverted signal of the enable signal ENSP, but as a signal that changes at a timing different from that of the enable signal ENSP. That is, as shown in FIG. 17, when the non-dead zone period is switched to the dead zone period, the enable signal ENCP changes from the high level to the low level after the enable signal ENSP changes from the low level to the high level. On the other hand, when the dead zone period is switched to the non-dead zone period, the enable signal ENSP changes from the high level to the low level after the enable signal ENCP changes from the low level to the high level. Accordingly, the second charge pump circuit 60 having a long reset time can be enabled at the early timing to shift to the appropriate FLL operation.

8. Frequency Divider Circuit

Figure 20:
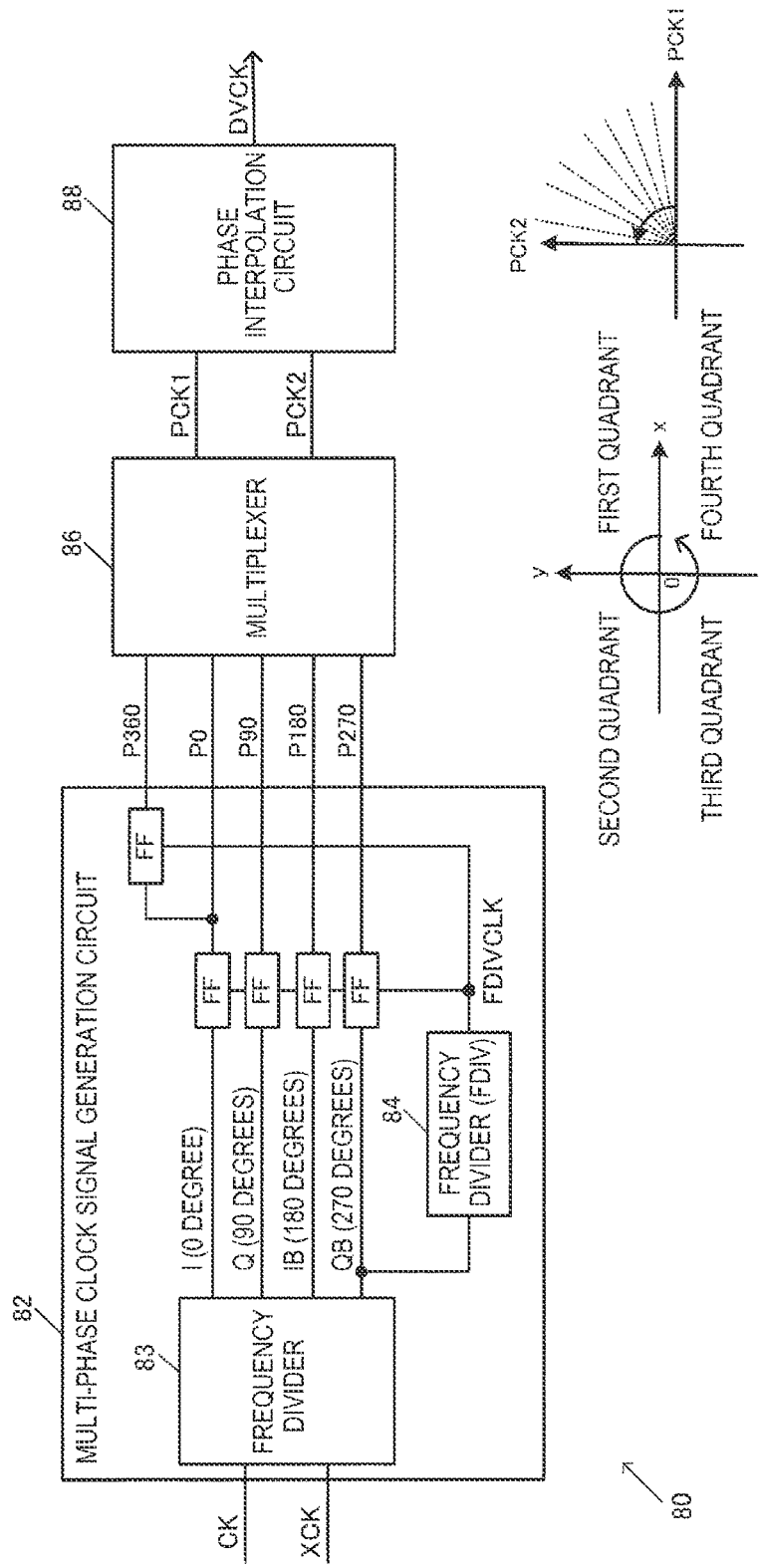
FIG. 20 shows a configuration example of a phase interpolation type frequency divider circuit.
Figure 21:
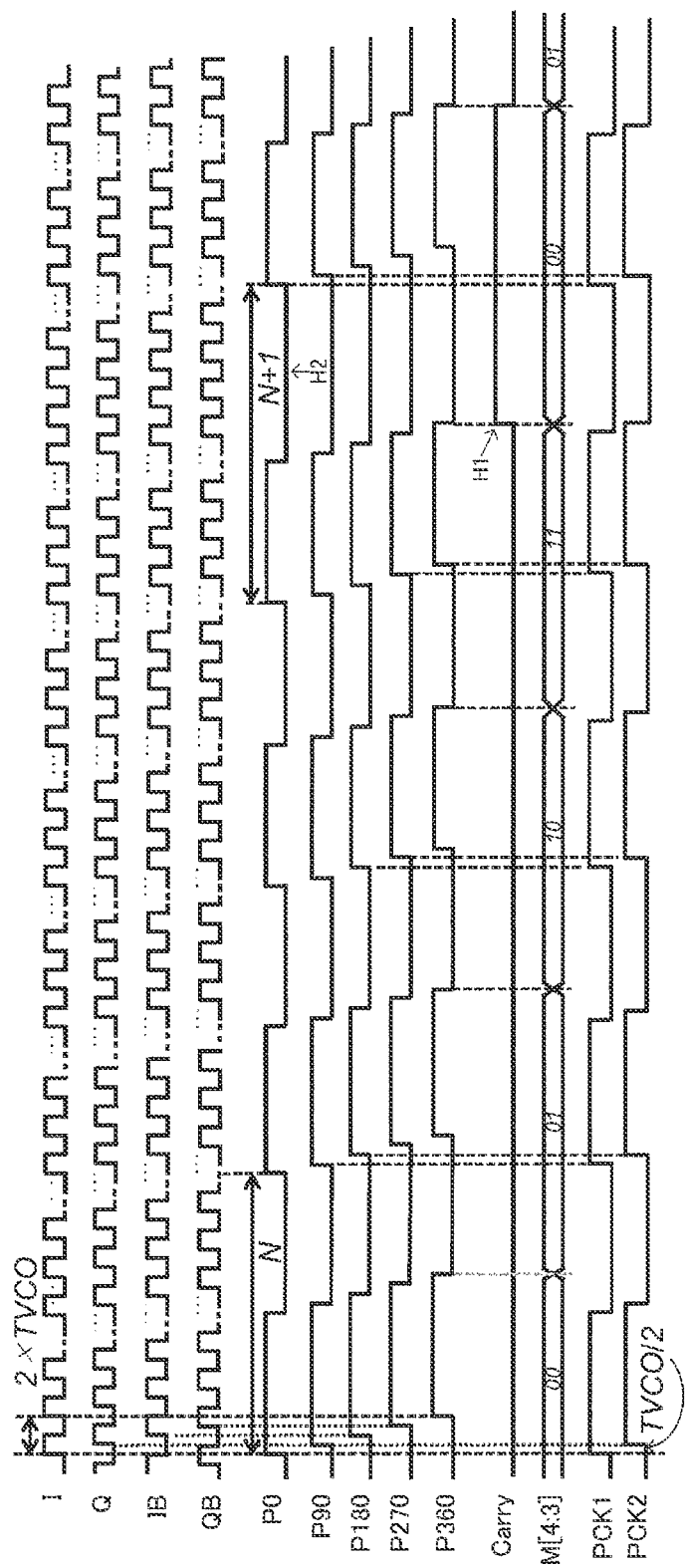
FIG. 21 is a signal waveform diagram showing an operation of the phase interpolation type frequency divider circuit.

FIG. 20 shows a configuration example of the frequency divider circuit 80. FIG. 21 is a signal waveform diagram showing an operation of the frequency divider circuit 80. FIG. 20 shows a configuration example of the phase interpolation type frequency divider circuit 80. The frequency divider circuit 80 includes a multi-phase clock signal generation circuit 82, a multiplexer 86, and a phase interpolation circuit 88. The multi-phase clock signal generation circuit 82 includes frequency dividers 83 and 84 and five flip-flop circuits FF.

The frequency divider 83 is a divide-by-2 frequency divider circuit. Specifically, the clock signal CK and a clock signal XCK obtained by inverting the clock signal CK are input to the frequency divider 83, and the frequency divider 83 outputs signals I, Q, IB, and QB obtained by dividing these signals by 2. When a cycle of the clock signal CK is TVCO, a cycle of the signals I, Q, IB, and QB divided by 2 is 2×TVCO, as shown in FIG. 21. That is, a frequency of the signals I, Q, IB, and QB is half a frequency of the clock signal CK. The signals Q, IB, and QB are signals whose phases are delayed by 90 degrees, 180 degrees, and 270 degrees, respectively, with respect to the signal I. In this way, the signals I, Q, IB, and QB are signals shifted in phase by every 90 degrees.

The frequency divider 84 is a frequency divider circuit called a feedback divider (FDIV). Specifically, the frequency divider 84 frequency-divides the signal QB by a set integer frequency division ratio N to output a signal FDIVCLK. The signal FDIVCLK is input to CK terminals of the flip-flop circuits FF that respectively receive the signals I, Q, IB, and QB at D terminals and is then sampled, so that frequency-divided clock signals P0, P90, P180, and P270 as shown in FIG. 21 are respectively output from Q terminals of the flip-flop circuits FF. The signal FDIVCLK is input to a CK terminal of the flip-flop circuit FF that receives the frequency-divided clock signal P0 at a D terminal and is then sampled, so that a frequency-divided clock signal P360 is output from a Q terminal of the flip-flop circuit FF.

As shown in FIG. 21, the frequency-divided clock signals P0, P90, P180, P270, and P360 are signals obtained by the frequency divider 84 frequency-dividing the signals I, Q, IB, QB, and I by the integer frequency division ratio N. For example, when the cycle of the signals I, Q, IB, QB, and I is 2×TVCO, a cycle of the frequency-divided clock signals P0, P90, P180, P270, and P360 is N×2×TVCO. The frequency-divided clock signals P0, P90, P180, P270, and P360 are signals whose signal levels change at edges corresponding to edges of the signals I, Q, IB, QB, and I. A phase difference between P0 and P90 corresponds to a phase difference between I and Q, and a phase difference between P90 and P180 corresponds to a phase difference between Q and IB. A phase difference between P180 and P270 corresponds to a phase difference between IB and QB, and a phase difference between P270 and P360 corresponds to a phase difference between QB and I.

As described above, the multi-phase clock signal generation circuit 82 outputs a plurality of frequency-divided clock signals P0, P90, P180, P270, and P360 which are clock signals obtained by frequency-dividing the clock signals CK and XCK by an integer frequency division ratio N×2 and have different phases.

For example, the circuit device 20 according to the embodiment includes a control circuit (not shown), and the control circuit includes a delta-sigma modulator that performs delta-sigma modulation which is based on the frequency division ratio setting code and an integrator that integrates an output of the delta-sigma modulator. The delta-sigma modulator performs delta-sigma modulation based on a decimal part of a frequency division ratio of the frequency division ratio setting code, and the integrator performs integration processing of an output value of the delta-sigma modulator. The control circuit outputs, to the frequency divider 84, an integer frequency division control code for setting the integer frequency division ratio N. The control circuit outputs an interpolation control code which is based on an integrated value of the integrator to the phase interpolation circuit 88 and the multiplexer 86. The control circuit corresponds to, for example, control circuits 160 and 260 in FIGS. 22 and 23. The delta sigma modulator and the integrator correspond to delta sigma modulators 162 and 262 and integrators 164 and 264 in FIGS. 22 and 23, respectively.

The multiplexer 86 selects an i-th frequency-divided clock signal PCK1 and an (i+1)-th frequency-divided clock signal PCK2 from the frequency-divided clock signals P0, P90, P180, P270, and P360 based on, for example, M[4:3] which is an upper order bit of M[4:0]. The M[4:0] is the interpolation control code from the control circuit. For example, based on the M[4:3] which is the upper order bit of the interpolation control code, when it is determined that the signal is in a first quadrant of 0 to 90 degrees, the frequency-divided clock signals P0 and P90 are selected as the PCK1 and PCK2, and when it is determined that the signal is in a second quadrant of 90 to 180 degrees, the frequency-divided clock signals P90 and P180 are selected as the PCK1 and PCK2. Based on the M[4:3] which is the upper order bit of the interpolation control code, when it is determined that the signal is in a third quadrant of 180 to 270 degrees, the frequency-divided clock signals P180 and P270 are selected as the PCK1 and PCK2, and when it is determined that the signal is in a fourth quadrant of 270 to 360 degrees, the frequency-divided clock signals P270 and P360 are selected as the PCK1 and PCK2.

The phase interpolation circuit 88 outputs, as the frequency-divided clock signal DVCK, an interpolation clock signal selected, based on, for example, M[2:0] which is a lower order bit of M[4:0], from a plurality of interpolation clock signals generated by phase interpolation which is based on the i-th frequency-divided clock signal PCK1 and the (i+1)-th frequency-divided clock signal PCK2. The M[4:0] is the interpolation control code. Here, i is an integer of 1 or more. The PCK1 and PCK2 are also included in the interpolation clock signal to be selected. For example, it is assumed that the signal is determined in the first quadrant based on the M[4:3] which is the upper order bit of the interpolation control code, and the frequency-divided clock signals P0 and P90 are selected as the PCK1 and PCK2. In this case, the phase interpolation circuit 88 outputs, as the frequency-divided clock signal DVCK, an interpolation clock signal selected, based on M[2:0] which is the lower order bit of the interpolation control code, from a plurality of interpolation clock signals generated by 8-division phase interpolation which is based on the i-th frequency-divided clock signal PCK1=P0 and the (i+1)-th frequency-divided clock signal PCK2=P90. For example, a k-th interpolation clock signal between an m-th interpolation clock signal and an n-th interpolation clock signal can be generated by short-circuiting an output terminal of a buffer for buffering the m-th interpolation clock signal and an output terminal of a buffer for buffering the n-th interpolation clock signal and causing the signals to collide with each other. Here, m, k, and n are integers of 1 or more that satisfy a relationship of m<k<n. For example, by connecting an output terminal of a buffer for buffering the PCK1 and an output terminal of a buffer for buffering the PCK2 and causing signals to collide with each other, a fourth interpolated clock signal for phase division can be generated. An output terminal of a buffer for buffering the PCK1 and an output terminal of a buffer for buffering a fourth interpolation clock signal for phase division are coupled to cause the signals to collide with each other, so that a second interpolation clock signal for phase division can be generated. The interpolation clock signal generated in this manner is often a narrow pulse signal.

As described above, the phase interpolation circuit 88 selects, based on the interpolation control code, the frequency-divided clock signal DVCK, which is a clock signal for phase comparison with the reference clock signal RFCK, from the plurality of interpolation clock signals generated by the phase interpolation which is based on the i-th frequency-divided clock signal PCK1 and the (i+1)-th frequency-divided clock signal PCK2 among the plurality of frequency-divided clock signals P0, P90, P180, P270, and P360. In this way, the phase interpolation type frequency divider circuit 80 can be implemented. According to the phase interpolation type frequency divider circuit 80, by using the interpolation clock signal phase-divided with high resolution, a width of frequency fluctuation due to the delta-sigma modulation can be reduced, and the clock signal CK with reduced phase noise can be generated.

For example, in FIG. 20, the multi-phase clock signal generation circuit 82 performs a 4-phase division, and the phase interpolation circuit 88 performs an 8-phase division, thereby performing a 32-phase division. Any one of the 32-phase-divided clock signals is selected by an interpolation control code which is based on the integrated value of the integrator that integrates the output of the delta-sigma modulator, and is output as the frequency-divided clock signal DVCK. In this case, the phase is integrated by the integrator that integrates the output of the delta-sigma modulator, and a carry signal is output from the control circuit to the frequency divider 84 as indicated by H1 in FIG. 21, for example, at a timing of transition from 31 to 0 in the 32-phase division, that is, at a timing at which the phase makes one cycle. Accordingly, as indicated by H2, the integer frequency division ratio of the frequency divider 84 is carried up from N to N+1. At a timing of transition from 0 to 31 in the 32-phase division, a carry-down signal is output from the control circuit to the frequency divider 84, and the integer frequency division ratio of the frequency divider 84 is carried-down.

9. Oscillator

Figure 22:
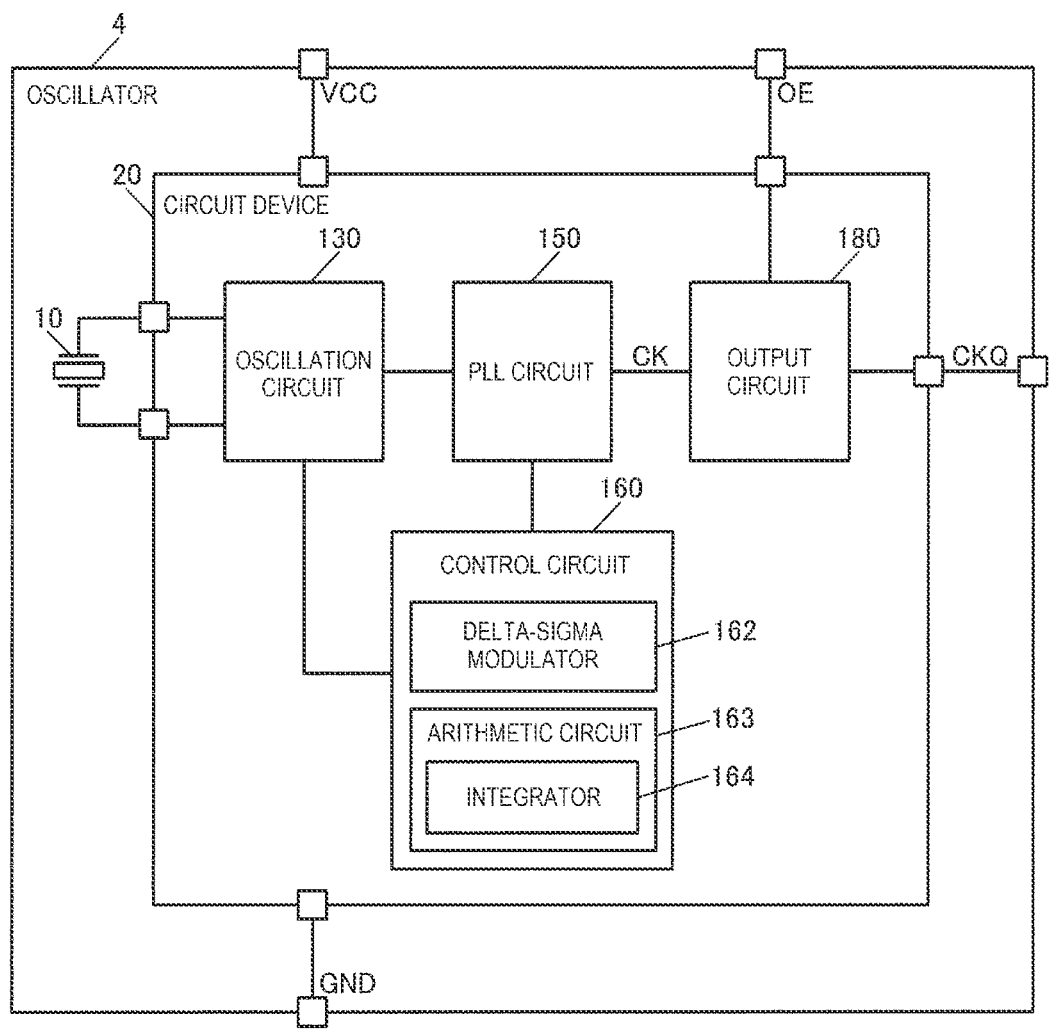
FIG. 22 shows a first configuration example of an oscillator according to the embodiment.

FIG. 22 shows a first configuration example of an oscillator 4 according to the embodiment. The oscillator 4 according to the embodiment includes the circuit device 20 according to the embodiment and a resonator 10 that generates the reference clock signal RFCK. For example, in FIG. 22, the resonator 10 is electrically coupled to the circuit device 20. For example, the resonator 10 and the circuit device 20 are electrically coupled to each other using an internal wiring, a bonding wire, a metal bump, or the like of a package that houses the resonator 10 and the circuit device 20.

The resonator 10 is an element that generates mechanical oscillation based on an electrical signal. The resonator 10 can be implemented by, for example, a resonator element such as a quartz crystal resonator element. For example, the resonator 10 can be implemented by a quartz crystal resonator element that has a cut angle of AT cut, SC cut, or the like and that performs thickness-shear oscillation, a tuning fork type quartz crystal resonator element, or a double-tuning fork type quartz crystal resonator element. For example, the resonator 10 may be a resonator built in a simple packaged crystal oscillator (SPXO), a resonator built in a temperature compensated crystal oscillator (TCXO) not provided with an oven, or a resonator built in an oven controlled crystal oscillator (OCXO) provided with an oven. The resonator 10 according to the embodiment can be implemented by various resonator elements such as a resonator element other than a thickness-shear oscillating type, a tuning fork type, or a double-tuning fork type, and a piezoelectric resonator element made of a material other than quartz crystal. For example, a surface acoustic wave (SAW) resonator, or a micro electro mechanical system (MEMS) resonator as a silicon resonator formed using a silicon substrate may be employed as the resonator 10.

The circuit device 20 in FIG. 22 includes an oscillation circuit 130, a PLL circuit 150, a control circuit 160, and an output circuit 180.

The oscillation circuit 130 is a circuit that oscillates the resonator 10. For example, the oscillation circuit 130 oscillates the resonator 10 to generate an oscillation signal. For example, the oscillation circuit 130 can be implemented by an oscillation drive circuit electrically coupled to one end and the other end of the resonator 10, and a passive element such as a capacitor and a resistor. The drive circuit can be implemented by, for example, a CMOS inverter circuit or a bipolar transistor. The drive circuit is a core circuit of the oscillation circuit 130, and the drive circuit oscillates the resonator 10 by driving the resonator 10 with a voltage or a current. As the oscillation circuit 130, various types of oscillation circuits such as an inverter type, a Pierce type, a Colpitts type, and a Hartley type can be used. The coupling in the embodiment is electrical coupling. The electrical coupling refers to coupling in which an electric signal can be transmitted, and refers to coupling in which information can be transmitted by the electric signal. The electrical coupling may be coupling via a passive element or the like.

The PLL circuit 150 is a PLL circuit implemented by the circuits according to the embodiment described with reference to FIG. 1 and the like. A clock signal which is based on an oscillation signal generated by the oscillation circuit 130 oscillating the resonator 10 is input to the PLL circuit 150 as the reference clock signal RFCK. The PLL circuit 150 performs phase comparison between the feedback clock signal FBCK and the reference clock signal RFCK which is based on the oscillation signal of the resonator 10, and generates the clock signal CK by the charge pump operation or the like. When the phase difference between the reference clock signal RFCK and the feedback clock signal FBCK does not fall within the dead zone, the PLL circuit 150 performs the synchronous operation by the FLL operation in the second feedback loop, and when the phase difference falls within the dead zone, the PLL circuit 150 performs the synchronous operation by the SPLL operation in the first feedback loop.

The control circuit 160 is a logic circuit and performs various types of control processing and arithmetic processing. For example, the control circuit 160 controls the entire circuit device 20 or controls an operation sequence of the circuit device 20. The control circuit 160 performs various types of processing for controlling the oscillation circuit 130. The control circuit 160 can be implemented by, for example, an application specific integrated circuit (ASIC) using automatic placement and routing such as a gate array.

The control circuit 160 includes a delta-sigma modulator 162 and an arithmetic circuit 163, and the arithmetic circuit 163 includes an integrator 164. For example, when the frequency divider circuit 80 according to the embodiment is a phase interpolation type frequency divider circuit or the like, the delta-sigma modulator 162 performs delta-sigma modulation based on a decimal part of the frequency division ratio of the frequency division ratio setting code, and the integrator 164 of the arithmetic circuit 163 performs integration processing of the output value of the delta-sigma modulator. Based on an interpolation control code which is based on an integration result of the integrator 164, processing of selecting the frequency-divided clock signal DVCK from the plurality of interpolation clock signals, or the like is performed. Further, based on an integer part of the frequency division ratio of the frequency division ratio setting code, an integer frequency divider of the frequency divider circuit 80 performs integer frequency division.

The output circuit 180 buffers the clock signal CK from the PLL circuit 150 and outputs the output clock signal CKQ. The output clock signal CKQ is an external output clock signal of the oscillator 4. The output circuit 180 corresponds to the output circuit 78 in FIG. 2. The output circuit 180 receives an output enable signal OE from the outside, and outputs the output clock signal CKQ when the output enable signal OE is active. Accordingly, the output clock signal CKQ is output to the outside of the oscillator 4. On the other hand, when the output enable signal OE is inactive, an output terminal of the output clock signal CKQ is set to a fixed voltage such as a low level.

In FIG. 22, the temperature compensation circuit is not provided, and in this case, the oscillator 4 is the SPXO oscillator. Specifically, the oscillator 4 is a programmable SPXO that can output the output clock signal CKQ having any frequency according to the frequency division ratio setting code set in the PLL circuit 150. However, in the configuration in FIG. 22, a temperature compensation circuit that performs temperature compensation processing based on a temperature detection result of a temperature sensor may be provided as a configuration of the TCXO oscillator 4. In this case, a variable capacitance circuit whose capacitance is controlled by a temperature compensation voltage from the temperature compensation circuit may be provided in the oscillation circuit 130.

Figure 23:
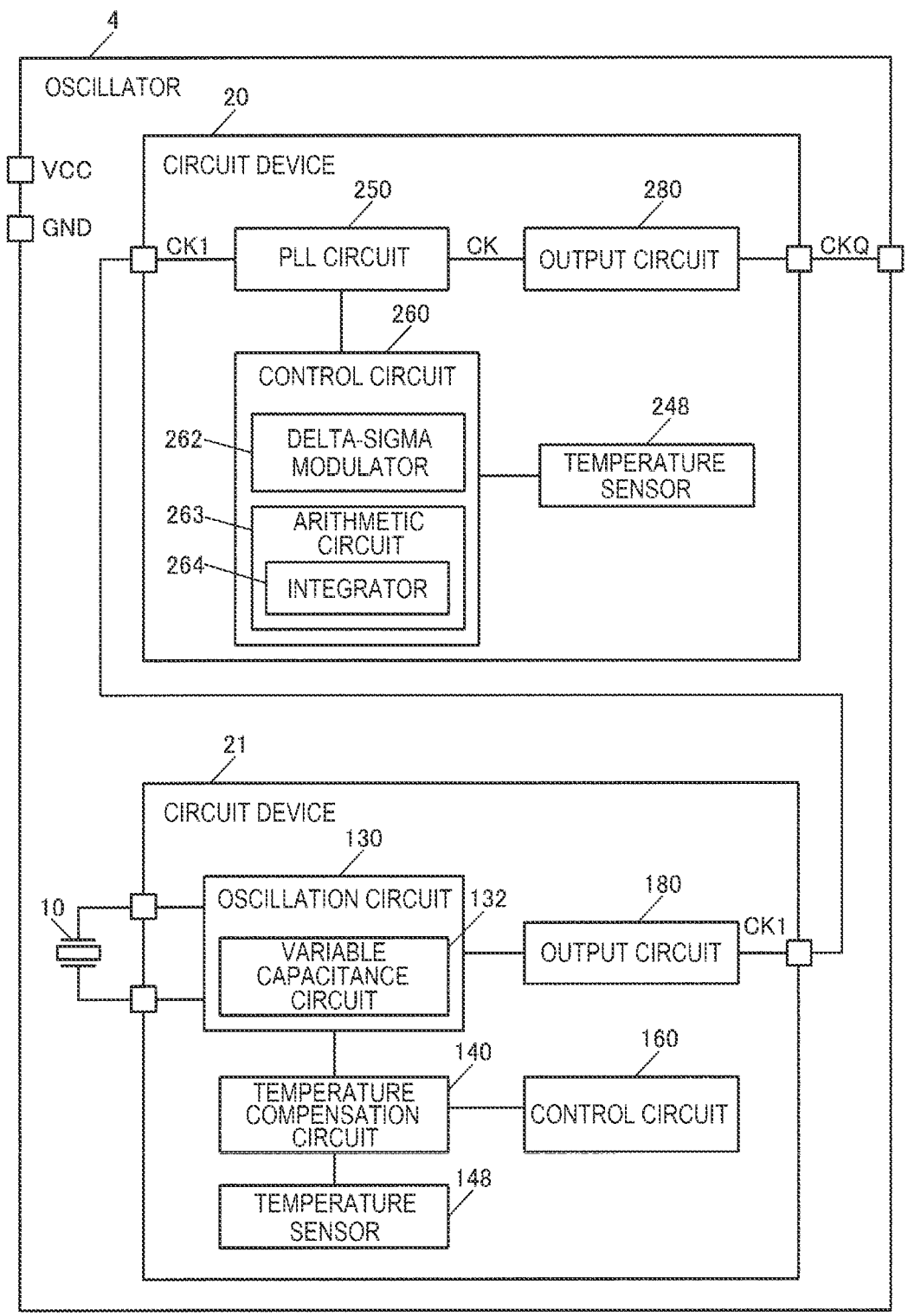
FIG. 23 shows a second configuration example of the oscillator according to the embodiment.

FIG. 23 shows a second configuration example of the oscillator 4. The oscillator 4 in FIG. 23 includes the resonator 10, a circuit device 21 which is a first circuit device, and the circuit device 20 according to the embodiment, which is a second circuit device.

The circuit device 21 includes the oscillation circuit 130, a temperature compensation circuit 140, a temperature sensor 148, the control circuit 160, and the output circuit 180. Configurations of the control circuit 160 and the output circuit 180 are the same as those in FIG. 22, and thus detailed description thereof will be omitted.

The oscillation circuit 130 includes a variable capacitance circuit 132. The variable capacitance circuit 132 is provided on at least one of one end and another end of the resonator 10, and is a circuit for adjusting load capacitance of the resonator 10. An oscillation frequency of the oscillation circuit 130 is adjusted by adjusting the capacitance of the variable capacitance circuit 132. The variable capacitance circuit 132 can be implemented by, for example, a variable capacitance element such as a varactor. For example, the variable capacitance circuit 132 can be implemented by a variable capacitance element whose capacitance is controlled based on the temperature compensation voltage. Alternatively, the variable capacitance circuit 132 may be implemented by a capacitance array and a switch array coupled to the capacitance array. In this case, the capacitance of the variable capacitance circuit 132 is controlled by turning on or off a plurality of switches in the switch array based on, for example, a digital control signal.

The temperature compensation circuit 140 is a circuit that performs temperature compensation of the oscillation frequency of the oscillation circuit 130. For example, the temperature compensation circuit 140 outputs, based on a temperature detection result of the temperature sensor 148, a temperature compensation signal for temperature compensation of the oscillation frequency of the oscillation circuit 130. The temperature compensation is, for example, processing of performing compensation by reducing fluctuation of the oscillation frequency caused by temperature fluctuation. That is, the temperature compensation circuit 140 performs temperature compensation for the oscillation frequency of the oscillation circuit 130 such that the oscillation frequency is constant even when temperature fluctuation occurs. Specifically, the temperature compensation circuit 140 generates a temperature compensation voltage as the temperature compensation signal. The capacitance of the variable capacitance circuit 132 is controlled by using the temperature compensation voltage as a capacitance control voltage, and thus the temperature compensation processing of the oscillation frequency can be implemented. As the temperature compensation circuit 140, for example, a temperature compensation circuit that performs analog type temperature compensation by using polynomial approximation can be used. For example, when the temperature compensation voltage for compensating frequency-temperature characteristics of the resonator 10 is approximated by a polynomial, the temperature compensation circuit 140 performs the analog type temperature compensation based on coefficient information of the polynomial. The analog type temperature compensation is, for example, temperature compensation implemented by addition processing of a current signal or a voltage signal that is an analog signal.

The temperature sensor 148 is a sensor that detects a temperature. Specifically, the temperature sensor 148 outputs, as a temperature detection voltage that is a temperature detection signal, a temperature dependent voltage that changes according to an environment temperature. For example, the temperature sensor 148 generates a temperature detection voltage, which is a temperature detection signal, by using a circuit element having temperature dependency. Specifically, the temperature sensor 148 outputs a temperature detection voltage that changes depending on the temperature by using, for example, temperature dependence of a forward voltage of a PN junction.

In FIG. 23, the temperature compensation circuit 140 performs first temperature compensation processing based on a temperature detection result of the temperature sensor 148. Accordingly, first temperature compensation processing is performed on the clock signal CK1 generated by the oscillation circuit 130 oscillating the resonator 10, and the clock signal CK1 subjected to the first temperature compensation processing is output from the circuit device 21. The clock signal CK1 subjected to the first temperature compensation processing is input to the circuit device 20.

The circuit device 20 includes a PLL circuit 250, a control circuit 260, a temperature sensor 248, and an output circuit 280.

The PLL circuit 250 is a PLL circuit implemented by the circuits according to the embodiment described with reference to FIG. 1 and the like. The clock signal CK1 which is based on the oscillation signal of the resonator 10 is input to the PLL circuit 250 from the circuit device 21 as the reference clock signal RFCK. The PLL circuit 250 performs a phase comparison between the feedback clock signal FBCK and the reference clock signal RFCK which is based on the oscillation signal of the resonator 10, and generates the clock signal CK by the charge pump operation or the like. When the phase difference between the reference clock signal RFCK and the feedback clock signal FBCK does not fall within the dead zone, the PLL circuit 250 performs the synchronous operation by the FLL operation in the second feedback loop, and when the phase difference falls within the dead zone, the PLL circuit 250 performs the synchronous operation by the SPLL operation in the first feedback loop.

The output circuit 280 buffers the clock signal CK from the PLL circuit 250 and outputs the output clock signal CKQ. The output clock signal CKQ is an external output clock signal of the oscillator 4.

The control circuit 260 includes a delta-sigma modulator 262 and an arithmetic circuit 263, and the arithmetic circuit 263 includes an integrator 264. Configurations and operations of the delta-sigma modulator 262 and the integrator 264 are the same as those of the delta-sigma modulator 162 and the integrator 164 in FIG. 22, and thus detailed description thereof will be omitted.

In addition, the circuit device 20 performs second temperature compensation processing. The second temperature compensation processing is performed by, for example, the arithmetic circuit 263 of the control circuit 260. That is, the circuit device 20 performs the second temperature compensation processing on the clock signal CK1 subjected to the first compensation processing by the circuit device 21. For example, the circuit device 20 performs the second temperature compensation processing based on a temperature detection result of the temperature sensor 248 or the like. Specifically, the arithmetic circuit 263 of the circuit device 20 performs the second temperature compensation processing by neural network arithmetic or the like based on temperature detection results of the temperature sensor 248 and the temperature sensor 148 and information of a trained model. For example, a storage circuit (not shown) stores the information of a trained model that is subjected to machine learning so as to obtain a temperature compensation value corresponding to each of the temperature measurement results. The arithmetic circuit 263 performs, based on the temperature detection results and the information of the trained model in the storage circuit, the second temperature compensation processing for obtaining a temperature compensation value corresponding to each temperature.

As described above, in FIG. 23, the circuit device 21 performs the first temperature compensation processing and outputs the clock signal CK1 to the circuit device 20, and the circuit device 20 performs the second temperature compensation processing and outputs the output clock signal CKQ. Accordingly, the output clock signal CKQ subjected to the first temperature compensation processing performed by the circuit device 21 and the second temperature compensation processing performed by the circuit device 20 is output from the oscillator 4. Thus, the output clock signal CKQ with reduced phase noise and the like can be output from the oscillator 4 while the temperature compensation processing can be implemented with higher accuracy. The circuit device 20 may be provided with a heater control circuit that controls a temperature of an oven to implement the OCXO oscillator 4.

As described above, a circuit device according to the embodiment includes a first phase comparison circuit including a sampling circuit that samples a feedback signal of a clock signal based on a reference clock signal, and configured to output a sampling voltage of the sampling circuit, and a first charge pump circuit configured to output a current corresponding to the sampling voltage. The circuit device includes a second phase comparison circuit including a dead zone detection circuit that detects whether a phase difference between a feedback clock signal of the clock signal and the reference clock signal falls within a dead zone, and configured to output a phase difference signal obtained based on a phase comparison between the reference clock signal and the feedback clock signal when the phase difference does not fall within the dead zone. The circuit device includes a second charge pump circuit configured to perform a charge pump operation corresponding to the phase difference signal, and a clock signal generation circuit configured to generate the clock signal having a frequency controlled based on an output of the first charge pump circuit or an output of the second charge pump circuit. The second charge pump circuit is set disabled or in a low power consumption mode in a dead zone period during which the phase difference falls within the dead zone.

According to the embodiment, the second charge pump circuit is set disabled or in the low power consumption mode in the dead zone period during which the phase difference between the reference clock signal and the feedback clock signal falls within the dead zone. In this way, in the dead zone period during which the charge pump operation performed by the second charge pump circuit is not required, wasteful power consumption in the second charge pump circuit and increasing of power consumption of the circuit device can be prevented. Therefore, while implementing a PLL circuit that enables a first synchronous operation in a first feedback loop and a second synchronous operation in a second feedback loop, the wasteful power consumption in the first synchronous operation in the first feedback loop is prevented, and thus low power consumption of the circuit device 20 can be implemented.

In the embodiment, the circuit device may further include a pulser circuit configured to output a pulse signal based on the reference clock signal. The first charge pump circuit may output a current corresponding to the sampling voltage in an active period of the pulse signal, and the pulser circuit may be set disabled or in a low power consumption mode in a non-dead zone period during which the phase difference does not fall within the dead zone.

In this way, during the second synchronous operation in the second feedback loop including the second phase comparison circuit, the second charge pump circuit, and the clock signal generation circuit, the wasteful power consumption in the pulser circuit can be prevented.

In the embodiment, the second phase comparison circuit may include an enable signal generation circuit configured to generate an enable signal that is active in the dead zone period and output the enable signal to the pulser circuit. The pulser circuit may be set disabled or in the low power consumption mode when the enable signal is inactive, and the second charge pump circuit may be set disabled or in the low power consumption mode when the enable signal is active.

In this way, when the enable signal is inactive in the non-dead zone period, the pulser circuit is set disabled or in the low power consumption mode, and thus the wasteful power consumption in the pulser circuit, which does not need to operate in the second synchronous operation in the second feedback loop, can be prevented. In addition, when the enable signal is active in the dead zone period, the second charge pump circuit is set disabled or in the low power consumption mode, and thus the wasteful power consumption in the second charge pump circuit, which does not need to operate in the first synchronous operation in the first feedback loop, can be prevented.

In the embodiment, the circuit device may further include a slope signal generation circuit configured to generate a slope signal based on the feedback clock signal, and the sampling circuit may sample the slope signal based on the reference clock signal.

In this way, the slope signal generation circuit generates a slope signal having a slope and the slope signal is sampled based on the reference clock signal, thereby outputting the sampling voltage.

In the embodiment, the dead zone detection circuit may set, after detecting that the phase difference falls within the dead zone having a first dead zone width, a width of the dead zone to a second dead zone width larger than the first dead zone width.

In this way, when it is detected that the phase difference falls within the dead zone having the first dead zone width, the width of the dead zone is changed to the second dead zone width larger than the first dead zone width. Thus, even when the phase difference increases due to noise or the like after falling within the dead zone, the phase difference can be prevented from being erroneously determined as not falling within the dead zone.

In the embodiment, the circuit device may further include a pulser circuit configured to output a pulse signal based on the reference clock signal. The second phase comparison circuit may include an enable signal generation circuit configured to generate a first enable signal that is active in the dead zone period, output the first enable signal to the pulser circuit, generate a second enable signal that is active in a non-dead zone period during which the phase difference does not fall within the dead zone, and output the second enable signal to the second charge pump circuit. When the non-dead zone period is switched to the dead zone period, the second enable signal may change from active to inactive after the first enable signal changes from inactive to active. When the dead zone period is switched to the non-dead zone period, the first enable signal may change from active to inactive after the second enable signal changes from inactive to active.

In this way, when the operation of the second charge pump circuit is enabled and is reset after being disabled or the like, the second enable signal changes to an active level at an early timing, and thus the operation of the second charge pump circuit can be reset at an early timing.

In the embodiment, the clock signal generation circuit may include a loop filter circuit configured to output a control voltage having an oscillation frequency based on an output of the first charge pump circuit or an output of the second charge pump circuit, and a voltage controlled oscillation circuit configured to generate the clock signal having the oscillation frequency corresponding to the control voltage.

In this way, the clock signal generated by the first synchronous operation in the first feedback loop including the first phase comparison circuit, the first charge pump circuit, and the clock signal generation circuit can be generated, and the clock signal generated by the second synchronous operation in the second feedback loop including the second phase comparison circuit, the second charge pump circuit, and the clock signal generation circuit can be generated.

In the embodiment, the second charge pump circuit may include a reference current generation circuit configured to generate a reference current based on a reference voltage, and a current output circuit configured to output, based on an up signal or a down signal from the second phase comparison circuit, a charge pump current which is based on a mirror current of the reference current.

In this way, a reference current that is maintained constant with respect to a change in a power supply voltage, a temperature, or the like can be generated, and a charge pump current that is maintained constant with respect to the change in the power supply voltage, the temperature, or the like can be output to the clock signal generation circuit.

In the embodiment, the reference current and the mirror current may be cut off in the dead zone period.

In this way, it is possible to prevent the reference current and the mirror current thereof from flowing unnecessarily in the second charge pump circuit, which does not need to operate in the dead zone period, thereby preventing power consumption.

In the embodiment, the current output circuit may include a P-type transistor provided between a high-potential-side power supply node and a first node, through which an up current flows as the charge pump current, and a first switch provided between the first node and an output node of the current output circuit and turned on when the up signal is active. The current output circuit may include an N-type transistor provided between a second node and a low-potential-side power supply node, through which a down current flows as the charge pump current, and a second switch provided between the output node and the second node and turned on when the down signal is active.

In this way, the charge pump current corresponding to the phase difference between the reference clock signal and the feedback clock signal is output to the clock signal generation circuit, and thus a frequency control of the clock signal corresponding to the phase difference can be implemented.

In the embodiment, the current output circuit may include a third switch provided between the first node and a mirror node of the output node and turned on when the up signal is inactive, and a fourth switch provided between the mirror node and the second node and turned on when the down signal is inactive. The current output circuit may include a voltage-follower-connected operational amplifier whose input terminal is coupled to the output node and whose output terminal is coupled to the mirror node.

In this way, the third switch and the fourth switch serving as mirror circuits of the first switch and the second switch are provided between the first node and the second node. A voltage of the mirror node between the third switch and the fourth switch can be set to a voltage the same as that of the output node between the first switch and the second switch by the voltage-follower-connected operational amplification.

An oscillator according to the embodiment includes the circuit device described above; and a resonator configured to generate the reference clock signal.

Although the present embodiment has been described in detail above, it will be easily understood by those skilled in the art that many modifications can be made without substantially departing from the novel matters and effects of the present disclosure. Therefore, all such modifications are intended to be included within the scope of the present disclosure. For example, a term cited with a different term having a broader meaning or the same meaning at least once in the description or in the drawings can be replaced with a different term at any place in the description or in the drawings. Further, all combinations of the present embodiment and the modifications are also included in the scope of the present disclosure. The configurations, operations, and the like of the circuit device and the oscillator are not limited to those described in the embodiment, and various modifications can be made.

What is claimed is:

1. A circuit device comprising:
a first phase comparison circuit including a sampling circuit that samples a feedback signal of a clock signal based on a reference clock signal, and configured to output a sampling voltage of the sampling circuit;
a first charge pump circuit configured to output a current corresponding to the sampling voltage;
a second phase comparison circuit including a dead zone detection circuit that detects whether a phase difference between a feedback clock signal of the clock signal and the reference clock signal falls within a dead zone, and configured to output a phase difference signal obtained based on a phase comparison between the reference clock signal and the feedback clock signal when the phase difference does not fall within the dead zone;
a second charge pump circuit configured to perform a charge pump operation corresponding to the phase difference signal;
a clock signal generation circuit configured to generate the clock signal having a frequency controlled based on an output of the first charge pump circuit or an output of the second charge pump circuit; and
a pulser circuit configured to output a pulse signal based on the reference clock signal, wherein
the second charge pump circuit is set disabled or in a low power consumption mode in a dead zone period during which the phase difference falls within the dead zone,
the first charge pump circuit outputs a current corresponding to the sampling voltage in an active period of the pulse signal, and
the pulser circuit is set disabled or in a low power consumption mode in a non-dead zone period during which the phase difference does not fall within the dead zone.

2. The circuit device according to claim 1, wherein
the second phase comparison circuit includes an enable signal generation circuit configured to generate an enable signal that is active in the dead zone period and output the enable signal to the pulser circuit,
the pulser circuit is set disabled or in a low power consumption mode when the enable signal is inactive, and
the second charge pump circuit is set disabled or in a low power consumption mode when the enable signal is active.

3. The circuit device according to claim 1, further comprising:
a slope signal generation circuit configured to generate a slope signal based on the feedback clock signal, wherein
the sampling circuit samples the slope signal based on the reference clock signal.

4. The circuit device according to claim 1, wherein
the dead zone detection circuit sets, after detecting that the phase difference falls within the dead zone having a first dead zone width, a width of the dead zone to a second dead zone width larger than the first dead zone width.

5. The circuit device according to claim 1, further comprising:
a pulser circuit configured to output a pulse signal based on the reference clock signal, wherein
the second phase comparison circuit includes an enable signal generation circuit configured to generate a first enable signal that is active in the dead zone period, output the first enable signal to the pulser circuit, generate a second enable signal that is active in a non-dead zone period during which the phase difference does not fall within the dead zone, and output the second enable signal to the second charge pump circuit,
when the non-dead zone period is switched to the dead zone period, the second enable signal changes from active to inactive after the first enable signal changes from inactive to active, and
when the dead zone period is switched to the non-dead zone period, the first enable signal changes from active to inactive after the second enable signal changes from inactive to active.

6. The circuit device according to claim 1, wherein
the clock signal generation circuit includes
a loop filter circuit configured to output a control voltage having an oscillation frequency based on an output of the first charge pump circuit or an output of the second charge pump circuit, and
a voltage controlled oscillation circuit configured to generate the clock signal having the oscillation frequency corresponding to the control voltage.

7. The circuit device according to claim 1, wherein
the second charge pump circuit includes
a reference current generation circuit configured to generate a reference current based on a reference voltage, and
a current output circuit configured to output, based on an up signal or a down signal from the second phase comparison circuit, a charge pump current which is based on a mirror current of the reference current.

8. The circuit device according to claim 7, wherein
the reference current and the mirror current are cut off in the dead zone period.

9. The circuit device according to claim 7, wherein
the current output circuit includes
a P-type transistor provided between a high-potential-side power supply node and a first node, through which an up current flows as the charge pump current,
a first switch provided between the first node and an output node of the current output circuit and turned on when the up signal is active,
an N-type transistor provided between a second node and a low-potential-side power supply node, through which a down current flows as the charge pump current, and
a second switch provided between the output node and the second node and turned on when the down signal is active.

10. The circuit device according to claim 9, wherein
the current output circuit includes
a third switch provided between the first node and a mirror node of the output node and turned on when the up signal is inactive, a fourth switch provided between the mirror node and the second node and turned on when the down signal is inactive, and a voltage-follower-connected operational amplifier whose input terminal is coupled to the output node and whose output terminal is coupled to the mirror node.

11. An oscillator comprising:

the circuit device according to claim 1; and a resonator configured to generate the reference clock signal.

12. A circuit device comprising:

a first phase comparison circuit including a sampling circuit that samples a feedback signal of a clock signal based on a reference clock signal, and configured to output a sampling voltage of the sampling circuit;

a first charge pump circuit configured to output a current corresponding to the sampling voltage;

a second phase comparison circuit including a dead zone detection circuit that detects whether a phase difference between a feedback clock signal of the clock signal and the reference clock signal falls within a dead zone, and configured to output a phase difference signal obtained based on a phase comparison between the reference clock signal and the feedback clock signal when the phase difference does not fall within the dead zone;

a second charge pump circuit configured to perform a charge pump operation corresponding to the phase difference signal; and a clock signal generation circuit configured to generate the clock signal having a frequency controlled based on an output of the first charge pump circuit or an output of the second charge pump circuit, wherein the second charge pump circuit is set disabled or in a low power consumption mode in a dead zone period during which the phase difference falls within the dead zone, and the dead zone detection circuit sets, after detecting that the phase difference falls within the dead zone having a first dead zone width, a width of the dead zone to a second dead zone width larger than the first dead zone width.

13. A circuit device comprising:

a first phase comparison circuit including a sampling circuit that samples a feedback signal of a clock signal based on a reference clock signal, and configured to output a sampling voltage of the sampling circuit;

a first charge pump circuit configured to output a current corresponding to the sampling voltage;

a second phase comparison circuit including a dead zone detection circuit that detects whether a phase difference between a feedback clock signal of the clock signal and the reference clock signal falls within a dead zone, and configured to output a phase difference signal obtained based on a phase comparison between the reference clock signal and the feedback clock signal when the phase difference does not fall within the dead zone;

a second charge pump circuit configured to perform a charge pump operation corresponding to the phase difference signal; and a clock signal generation circuit configured to generate the clock signal having a frequency controlled based on an output of the first charge pump circuit or an output of the second charge pump circuit, wherein the second charge pump circuit is set disabled or in a low power consumption mode in a dead zone period during which the phase difference falls within the dead zone, and the second charge pump circuit includes a reference current generation circuit configured to generate a reference current based on a reference voltage, and a current output circuit configured to output, based on an up signal or a down signal from the second phase comparison circuit, a charge pump current which is based on a mirror current of the reference current.

* * * * *